United States Patent
Kim et al.

(10) Patent No.: US 8,552,890 B2
(45) Date of Patent: Oct. 8, 2013

(54) LOSSLESS CODING WITH DIFFERENT PARAMETER SELECTION TECHNIQUE FOR CABAC IN HEVC

(75) Inventors: Seung-Hwan Kim, Vancouver, WA (US); Christopher Andrew Segall, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/444,710

(22) Filed: Apr. 11, 2012

(65) Prior Publication Data

US 2013/0187797 A1    Jul. 25, 2013

Related U.S. Application Data

(63) Continuation-in-part of application No. 13/365,215, filed on Feb. 2, 2012, which is a continuation-in-part of application No. 13/360,615, filed on Jan. 27, 2012, which is a continuation-in-part of application No. 13/354,272, filed on Jan. 19, 2012.

(51) Int. Cl.
*H03M 7/34* (2006.01)

(52) U.S. Cl.
USPC ............. 341/51; 709/217; 709/219; 709/246; 382/305; 382/306; 382/311; 375/240.03; 375/240.01; 375/E7.026; 375/E7.126

(58) Field of Classification Search
USPC ............... 341/50–90; 382/305, 306, 311; 709/217, 219, 246; 375/240.03, 375/240.01, E7.026, E7.126
See application file for complete search history.

(56) References Cited

U.S. PATENT DOCUMENTS

| | | | |
|---|---|---|---|
| 6,658,167 B1 * | 12/2003 | Lee et al. | ....................... 382/305 |
| 7,088,271 B2 | 8/2006 | Marpe et al. | |
| 7,167,988 B2 * | 1/2007 | Hayashi | ........................ 713/187 |
| 7,286,710 B2 | 10/2007 | Marpe et al. | |
| 7,369,066 B1 | 5/2008 | Menzreba | |
| 7,991,610 B2 * | 8/2011 | Sperschneider et al. | ...... 704/201 |
| 8,046,214 B2 * | 10/2011 | Mehrotra et al. | ......... 704/200.1 |
| 8,180,915 B2 * | 5/2012 | Zhao | ............................. 709/231 |
| 8,249,883 B2 * | 8/2012 | Mehrotra et al. | ............. 704/501 |
| 2013/0114684 A1 | 5/2013 | Kim | |
| 2013/0114687 A1 | 5/2013 | Kim | |

OTHER PUBLICATIONS

Joint Collaborative Team on Video Coding (JCT-VC) of ITU-T SG16 WP3 and ISO/IEC JTC1/SC29/WG11, "WD5: Working Draft 5 of High-Efficiency Video Coding", 7th Meeting: Geneva, CH, Nov. 21-30, 2011; Version 4—Jan. 9, 2012; 215 pages.

(Continued)

*Primary Examiner* — Lam T Mai
(74) *Attorney, Agent, or Firm* — Stolowitz Ford Cowger LLP

(57) ABSTRACT

A system utilizing a high throughput lossless coding mode for CABAC in HEVC is described. The system may include an electronic device configured to obtain a block of data to be encoded using an arithmetic based encoder; determine whether the block of data is to be encoded using lossless encoding; in response to determining that the block of data is not to be encoded using lossless encoding, use a first Absolute-3 coding technique to encode the block of data; in response to determining that the block of data is to be encoded using lossless encoding, use a second Absolute-3 coding technique to encode the block of data; wherein the second Absolute-3 coding technique is different than the first Absolute-3 coding technique.

20 Claims, 40 Drawing Sheets

(56) References Cited

OTHER PUBLICATIONS

Joint Collaborative Team on video Coding (JCT-VC) of ITU-T SG16 WP3 and ISO/IEC JTC1/SC29/WG11; Title: "WD4: Working Draft 4 of High-Efficiency Video Coding"; Authors: Benjamin Bross, Woo-Jin Han, Jens-Rainer Ohm, Gary J. Sullivan and Thomas Wiegand; 6th Meeting: Torino, IT; Jul. 14-22, 2011; 235 pages.

Joint Collaborative Team on Video Coding (JCT-VC) of ITU-T SG16 WP3 and ISO/ISC JTC1/SC29/WG11; Title: "Single entropy coder for HEVC with a high throughput binarization mode"; Authors: Jani Lainema, Kemal Ugur and Antti Hallapuro; 7th Meeting: Geneva, CH; Nov. 21-30, 2011; 9 pages.

International Searching Authority; International Search Report dated Apr. 23, 2013 for PCT/JP2013/000242; 4 pages.

* cited by examiner (background)

| Scanning Position | 0 | 1 | 2 | 3 | 4 | 5 | 6 | 7 | ... |
|---|---|---|---|---|---|---|---|---|---|
| Coefficient Level | 4 | 0 | 3 | -3 | 2 | 1 | 0 | -1 | ... |
| 1. Last_position_X Last_position_Y | | | | | | | | 2 1 | |
| 2. Significance Map | 1 | 0 | 1 | 1 | 1 | 1 | 0 | | |
| 3. Greater_than_1 | 1 | | 1 | 1 | 1 | 0 | | | |
| Greater_than_2 | 1 | | 1 | 1 | 0 | | | | |
| Sign Information | + | | + | - | + | + | | - | |
| Absolute -3 | 1 | | 0 | 0 | | | | | |

* Coefficients are coded in reverse scanning order

FIG. 2
(background)

(background)

Encoder processing using high throughput binarization mode

| sign | Abs (coeff-icient[i]) | Input |
|---|---|---|
| + | 1 | 0 |
| - | 1 | 1 |
| + | 2 | 2 |
| - | 2 | 3 |
| + | 3 | 4 |
| - | 3 | 5 |
| + | 4 | 6 |
| - | 4 | 7 |
| ... | ... | ... |

Mapping Table for Input Value input = (abs (coefficient[i])-1)<<1 + sign
(sign +:0, -:1)

FIG. 9

| Input value | Codeword (VLC-Table0) | Codeword (VLC-Table1) | Codeword (VLC-Table2) | Codeword (VLC-Table3) | Codeword (VLC-Table4) |
|---|---|---|---|---|---|
| 0 | 1 | 10 | 100 | 1000 | 10000 |
| 1 | 01 | 11 | 101 | 1001 | 10001 |
| 2 | 001 | 010 | 110 | 1010 | 10010 |
| 3 | 0001 | 011 | 111 | 1011 | 10011 |
| 4 | 00001 | 0010 | 0100 | 1100 | 10100 |
| 5 | 000001 | 0011 | 0101 | 1101 | 10101 |
| 6 | 0000001 | 00010 | 0110 | 1110 | 10110 |
| 7 | 00000010 | 00011 | 0111 | 1111 | 10111 |
| 8 | 000000011 | 000010 | 00100 | 01000 | 11000 |
| 9 | 000000000100 | 000011 | 00101 | 01001 | 11001 |
| 10 | 0000000000101 | 0000010 | 00110 | 01010 | 11010 |
| 11 | 00000000000110 | 0000011 | 00111 | 01011 | 11011 |
| 12 | 00000000000111 | 00000010 | 000100 | 01100 | 11100 |
| ... | ... | ... | ... | ... | ... | if (input > (Table[vlc])) vlc ++;
   where Table[VLC] = {3,5,13,27};
'vlc' represents the current vlc table number and stop 'vlc'
table updating when vlc is equal to 4

FIG. 10

| Scanning Position | 0 | 1 | 2 | 3 | 4 | 5 | 6 | 7 | ... |
|---|---|---|---|---|---|---|---|---|---|
| Coefficient Level | 4 | 0 | 3 | -3 | 2 | 1 | 0 | -1 | ... |
| 1. Last_position_X<br>Last_position_Y |  |  |  |  |  |  |  | 2<br>1 |  |
| 2. Significance Map | 1 | 0 | 1 | 1 | 1 | 1 | 0 |  |  |
| 3. Greater_than_1 | 1 |  | 1 | 1 | 1 | 0 |  |  |  |
| Greater_than_2 | 1 |  | 1 | 1 | 0 |  |  |  |  |
| Sign Information | + |  | + | − | + | + |  | − |  |
| Absolute -3 | 1 |  | 0 | 0 |  |  |  |  |  |

\* Coefficients are coded in reverse scanning order

FIG. 11
(background)

| Symbol / Rice Parameter | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | 0 | 0 | 1 | 1 | 1 | 2 | 2 | 2 | 2 | 2 | 2 | 3 | 3 | 3 | 3 | 3 | 3 | 3 | 3 | 3 | 3 | 3 | 4 |
| 1 | 1 | 1 | 1 | 1 | 1 | 1 | 2 | 2 | 2 | 2 | 2 | 2 | 3 | 3 | 3 | 3 | 3 | 3 | 3 | 3 | 3 | 3 | 3 | 4 |
| 2 | 2 | 2 | 2 | 2 | 2 | 2 | 2 | 2 | 2 | 2 | 2 | 2 | 3 | 3 | 3 | 3 | 3 | 3 | 3 | 3 | 3 | 3 | 3 | 4 |
| 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 4 |
| 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |

Rice parameter update table

FIG. 28

| Scanning Position | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Coefficient Level | 18 | -9 | 6 | 7 | 4 | -6 | 2 | 4 | -4 | -1 | 4 | 2 | -3 | 0 | 0 | 0 |
| Significance Map | 1 | 1 | 1 | 1 | 1 | 1 | 1 | 1 | 1 | 1 | 1 | 1 | 1 | 0 | 0 | 0 |
| Greater_than_1 | 1 | 1 | 1 | 1 | 1 | 1 | 1 | 1 | 1 | 0 | 1 | 1 | 1 | | | |
| Greater_than_2 | 1 | - | 1 | 1 | 1 | 1 | 0 | 1 | 1 | 0 | 1 | 0 | - | | | |
| Sign Information | + | - | + | + | + | - | + | + | - | - | + | + | - | | | |
| Absolute -3 | 15 | 6 | 3 | 4 | 1 | 3 | | 1 | 1 | | 1 | 0 | 0 | | | |

* Coefficients are coded in reverse scanning order

Bypass coding  Context based coding  Additionally context coded bins

FIG. 36

LOSSLESS CODING WITH DIFFERENT PARAMETER SELECTION TECHNIQUE FOR CABAC IN HEVC

This application is a continuation-in-part of U.S. patent application Ser. No. 13/365,215 filed on Feb. 2, 2012 and entitled "HIGH THROUGHPUT SIGNIFICANCE MAP PROCESSING FOR CABAC IN HEVC", which is a continuation-in-part of U.S. patent application Ser. No. 13/360,615 filed on Jan. 27, 2012 and entitled "LOSSLESS CODING TECHNIQUE FOR CABAC IN HEVC", which is a continuation-in-part of U.S. patent application Ser. No. 13/354,272 filed on Jan. 19, 2012 and entitled "HIGH THROUGHPUT BINARIZATION (HTB) METHOD FOR CABAC IN HEVC", each of which is incorporated by reference herein in its entirety.

TECHNICAL FIELD

The present disclosure relates generally to electronic devices. More specifically, the present disclosure relates to electronic devices utilizing enhanced Context Adaptive Binary Arithmetic Coding (CABAC) for lossless encoding and/or decoding.

BACKGROUND

Many decoders (and encoders) receive (and encoders provide) encoded data for blocks of an image. Typically, the image is divided into blocks and each of the blocks is encoded in some manner, such as using a discrete cosine transform (DCT), and provided to the decoder. A block may denote a rectangular region in an image and consist of pixels, for example a 16×16 block is a region 16× pixels in width and 16× pixels in height. The decoder receives the encoded blocks and decodes each of the blocks in some manner, such as using an inverse discrete cosine transform.

Video coding standards, such as MPEG-4 part 10 (H.264), compress video data for transmission over a channel with limited bandwidth and/or limited storage capacity. These video coding standards include multiple coding stages such as intra prediction, transform from spatial domain to frequency domain, quantization, entropy coding, motion estimation, and motion compensation, in order to more effectively encode and decode frames.

The Joint Collaborative Team on Video Coding (JCT-VC) of the International Telecommunication Union Telecommunication Standardization Sector (ITU-T) Study Group 16 (SG16) Working Party 3 (WP3) and International Organization for Standardization/International Electrotechnical Commission (ISO/IEC) Joint Technical Committee 1/Subcommittee 29/Working Group 11 (JTC1/SC29/WG11) has launched a standardization effort for a video coding standard called the High Efficiency Video Coding standard (HEVC). Similar to some prior video coding standards, HEVC is block-based coding. An example of a known HEVC encoder is shown in FIG. 1. HEVC decoders are also known.

In HEVC, Context-Adaptive Binary Arithmetic Coding (CABAC) is used to compress Transformed and Quantized Coefficients (TQCs) without loss. The TQCs are determined at the encoder by processing image blocks with a forward transform to generate transform coefficients that are then quantized using an operation that maps multiple transform coefficient values to TQCs values. The TQCs values are then communicated to the decoder as Coefficient Level values, or level values, and the level value for each coefficient is then mapped to a transform coefficient value that is similar, but not necessarily identical to, the transform coefficient value computed at the encoder. CABAC based encoding and/or decoding technique is generally context adaptive which refers to (i) adaptively coding symbols based on the values of previous symbols encoded and/or decoded in the past, and (ii) context, which identifies the set of symbols encoded and/or decoded in the past used for adaptation. The past symbols may be located in spatial and/or temporal adjacent blocks. In many cases, the context is based upon symbol values of neighboring blocks.

As mentioned above, CABAC may be used to compress TQCs without loss. By way of background, TQCs may be from different block sizes according to transform sizes (e.g., 4×4, 8×8, 16×16, 32×32, 16×32). Two-dimensional (2D) TQCs may be converted into a one-dimensional (1D) array before entropy coding. In an example, 2D arrayed TQCs in a 4×4 block may be arranged as illustrated in Table (1).

TABLE (1)

| 4 | 0 | 1 | 0 |
|---|---|---|---|
| 3 | 2 | −1 | ... |
| −3 | 0 | ... | ... |
| 0 | ... | ... | ... |

When converting the 2D TQCs into a 1D array, the block may be scanned in a diagonal zig-zag fashion. Continuing with the example, the 2D arrayed TQCs illustrated in Table (1) may be converted into 1D arrayed TQCs [4, 0, 3, −3, 2, 1, 0, −1, 0, . . . ] by scanning the first row and first column, first row and second column, second row and first column, third row and first column, second row and second column, first row and third column, first row and fourth column, second row and third column, third row and second column, fourth row and first column and so on.

The 1D array of TQCs is represented by a sequence of Syntax Elements (SEs) in CABAC. An example of the sequence of SEs for the example 1D array of TQCs is shown in FIG. 2. The SEs represent the following parameters: Last position X/Y, Significance Map, and the attributes Greater than 1, Greater than 2, Sign Information, and Absolute-3. The last position X/Y represents the position (X/Y) of the last non-zero coefficient in the corresponding block. Significance map represents the significance of each coefficient. Greater than 1 indicates whether the coefficient amplitude is larger than one for each non-zero coefficient (i.e. with significant flag as 1). Greater than 2 indicates whether the coefficient amplitude is larger than two for each coefficient with amplitude larger than one (i.e. with greater than 1 flag as 1).

In CABAC in HEVC, the representative SEs are coded. FIG. 3 shows the CABAC framework used for coding SEs. The CABAC coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be coded into bits using either a "bypass encoding engine" or a "regular encoding engine".

For the regular encoding engine in CABAC, in the second stage a probability model is selected. The probability model is used to arithmetic encode one or more bins of the binarized input symbols. This model may be selected from a list of available probability models depending on the context, which is a function of recently encoded symbols. The probability model stores the probability of a bin being "1" or "0". In the third stage, an arithmetic encoder encodes each bin according to the selected probability model. There are two sub-ranges for each bin, corresponding to a "0" and a "1". The fourth stage involves updating the probability model. The selected probability model is updated based on the actual encoded bin value (e.g., if the bin value was a "1", the frequency count of the "1"s is increased). The decoding technique for CABAC decoding reverses the process.

For the bypass encoding engine in CABAC, the second stage involves conversion of bins to bits omitting the computationally expensive context estimation and probability update stages. The bypass encoding engine assumes a fixed probability distribution for the input bins. The decoding technique for CABAC decoding reverses the process.

The CABAC encodes the symbols conceptually using two steps. In the first step, the CABAC performs a binarization of the input symbols to bins. In the second step, the CABAC performs a conversion of the bins to bits using either the bypass encoding engine or the regular encoding engine. The resulting encoded bit values are provided in the bitstream to a decoder.

The CABAC decodes the symbols conceptually using two steps. In the first step, the CABAC uses either the bypass decoding engine or the regular decoding engine to convert the input bits to bin values. In the second step, the CABAC performs de-binarization to recover the transmitted symbol value for the bin values. The recovered symbol may be non-binary in nature. The recovered symbol value is used in remaining aspects of the decoder.

As previously described, the encoding and/or decoding process of the CABAC includes at least two different modes of operation. In a first mode, the probability model is updated based upon the actual coded bin value, generally referred to as a "regular coding mode". The regular coding mode requires several sequential serial operations together with its associated computational complexity and significant time to complete. In a second mode, the probability model is not updated based upon the actual coded bin value, generally referred to as a "bypass coding mode". In the second mode, there is no probability model (other than perhaps a fixed probability) for decoding the bins, and accordingly there is no need to update the probability model.

When utilizing CABAC coding in HEVC, throughput performance can differ depending on different factors such as but not limited to: total number of bins/pixels, number of bypass bins/pixels, and number of regular (or context) coded bins/pixels. Generally speaking, throughput for the case of high bit-rate encoding (low Quantization Parameter (QP) value) is significantly less than throughput in other cases. Therefore, throughput in high bit-rate cases may consume a significant amount of processing resources and/or may take a significant amount of time to encode/decode. The disclosure that follows solves this and other problems.

It is also known that CABAC can be used in a lossless coding mode to compress a residual sample. In one example, a residual sample is a value corresponding to a specific location in an image. Typically, a residual sample corresponds to the difference between a value corresponding to a specific location in an image and a prediction value corresponding to the same, specific location in an image. Alternatively, a residual sample is a value corresponding to a specific location in an image that has not been processed with a transformation operation, or a transformation operation that is not typically used to create TQCs. A residual sample can be from different block sizes according to its sample size (4×4, 8×8, 16×16, 32×32, 16×32, etc.) A 2D residual sample block is first converted into a 1D array before entropy coding, similar to TQC encoding. In an example, 2D arrayed residual sample in a 4×4 block may be arranged as illustrated in Table (2).

TABLE (2)

| 4  | 0 | 1  | 0 |
|----|---|----|---|
| 3  | 2 | −1 | … |
| −3 | 0 | …  | … |
| 0  | … | …  | … |

When converting the 2D residual sample into a 1D array, the block may be scanned in a diagonal zig-zag fashion. Continuing with the example, the 2D arrayed residual sample illustrated in Table (2) may be converted into 1D arrayed residual sample [4, 0, 3, −3, 2, 1, 0, −1, 0, . . . ] by scanning the first row and first column, first row and second column, second row and first column, third row and first column, second row and second column, first row and third column, first row and fourth column, second row and third column, third row and second column, fourth row and first column and so on.

The 1D array of the residual sample is represented by a sequence of Syntax Elements (SEs) in CABAC. An example of a sequence of SEs for the example 1D array of the residual sample is shown in FIG. 11. The SEs represent the following parameters: Last position X/Y, Significance Map, and the attributes Greater than 1, Greater than 2, Sign Information, and Absolute-3.

In the lossless coding mode of CABAC in HEVC, the representative SEs are coded. The CABAC framework of FIG. 3 may be used for coding the SEs. The CABAC coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be coded into bits using the previously described "regular encoding engine".

For the regular encoding engine in the lossless coding mode of CABAC, in the second stage a probability model (also known as a "context model" in the lossless encoding mode of CABAC) is selected. The model is used to arithmetic encode one or more bins of the binarized input symbols. This model may be selected from a list of available models depending on the context, which is a function of recently encoded symbols. The model stores the probability of a bin being "1" or "0". In the third stage, an arithmetic encoder encodes each bin according to the selected model. There are two sub-ranges for each bin, corresponding to a "0" and a "1". The fourth stage involves updating the model. The selected model is updated based on the actual encoded bin value (e.g., if the bin value was a "1", the frequency count of the "1"s is increased). The decoding technique for CABAC decoding reverses the process.

The number of models used as described in the previous paragraph may be 184. Specifically: 36 models used for Last position X/Y (18 models for Last_position_X, 18 models for Last_position_Y); 48 models used for Significance Map (4×4 block: 9 luma, 6 chroma; 8×8 block: 11 luma, 11 chroma; 16×16 or 32×32 block: 7 luma, 4 chroma); and 100 models used for the attributes Greater than 1, Greater than 2, Sign Information, and Absolute-3 (Greater_than_1 flag of luma: 30; Greater_than_1 flag of chroma 20, Greater_than_2 flag of luma: 30; and Greater_than_2 flag of chroma 20).

When utilizing CABAC encoding in HEVC in the lossless coding mode, encoding/decoding is computationally complex. One reason for the computation complexity is the use of 184 models, as explained above. Due to this computation complexity, encoding/decoding may consume a significant amount of processing resources and/or may take a significant amount of time to complete. The disclosure that follows solves this and other problems.

BRIEF DESCRIPTION OF THE DRAWINGS

FIG. 2 is a table showing a sequence of syntax elements according to CABAC.

FIG. 9 illustrates a mapping table that may be used for determining an input value in high throughput binarization mode.

FIG. 10 illustrates a plurality of binarization tables that may be used for adaptive binarization in high throughput binarization mode.

FIG. 11 is a table showing a sequence of syntax elements according to a lossless coding mode in CABAC.

FIG. 28 is a table used for updating a Rice parameter according to a lossless coding mode in CABAC.

FIG. 36 is an example syntax element generated according to the configuration of FIG. 34.

DETAILED DESCRIPTION

Figure 1:
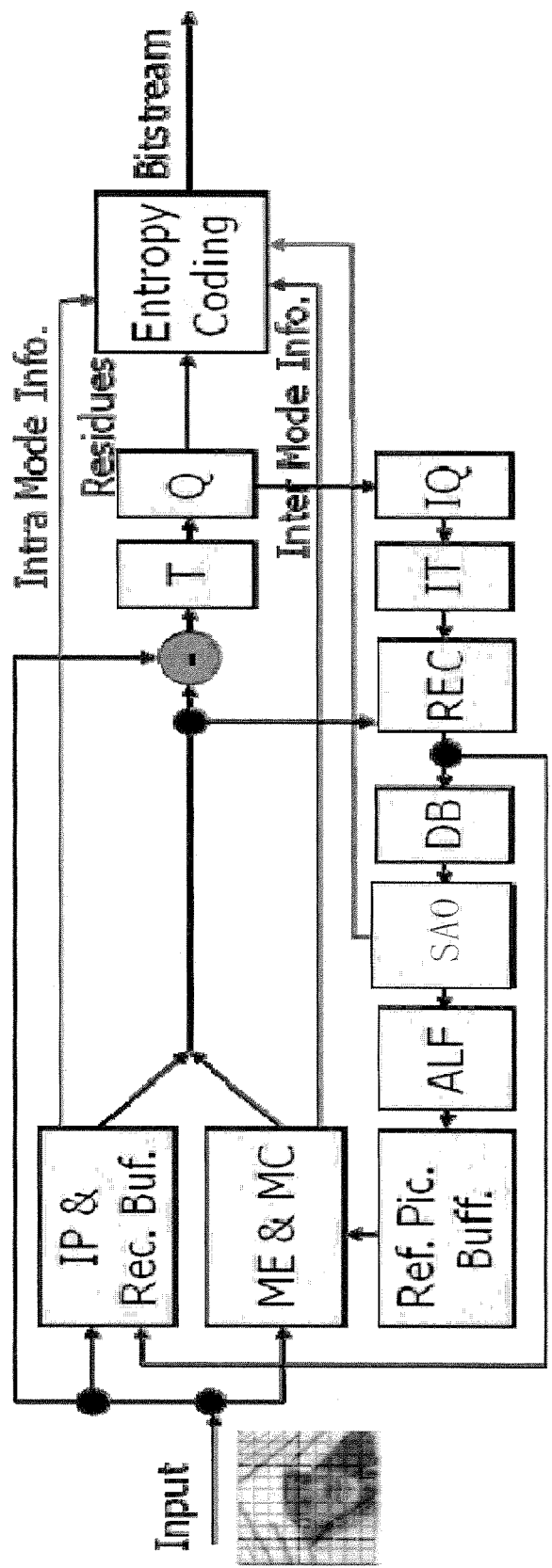
FIG. 1 is a block diagram of an HEVC encoder.
Figure 3:
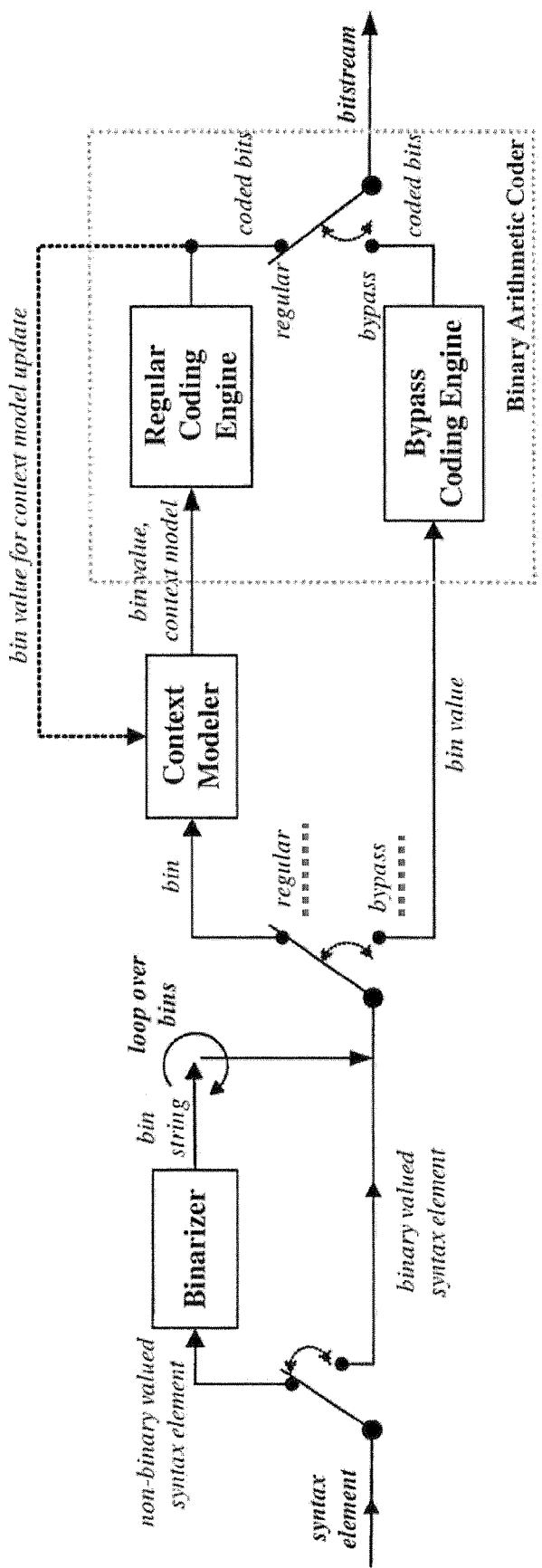
FIG. 3 is a block diagram of the CABAC framework for a sequence of syntax elements.
Figure 4:
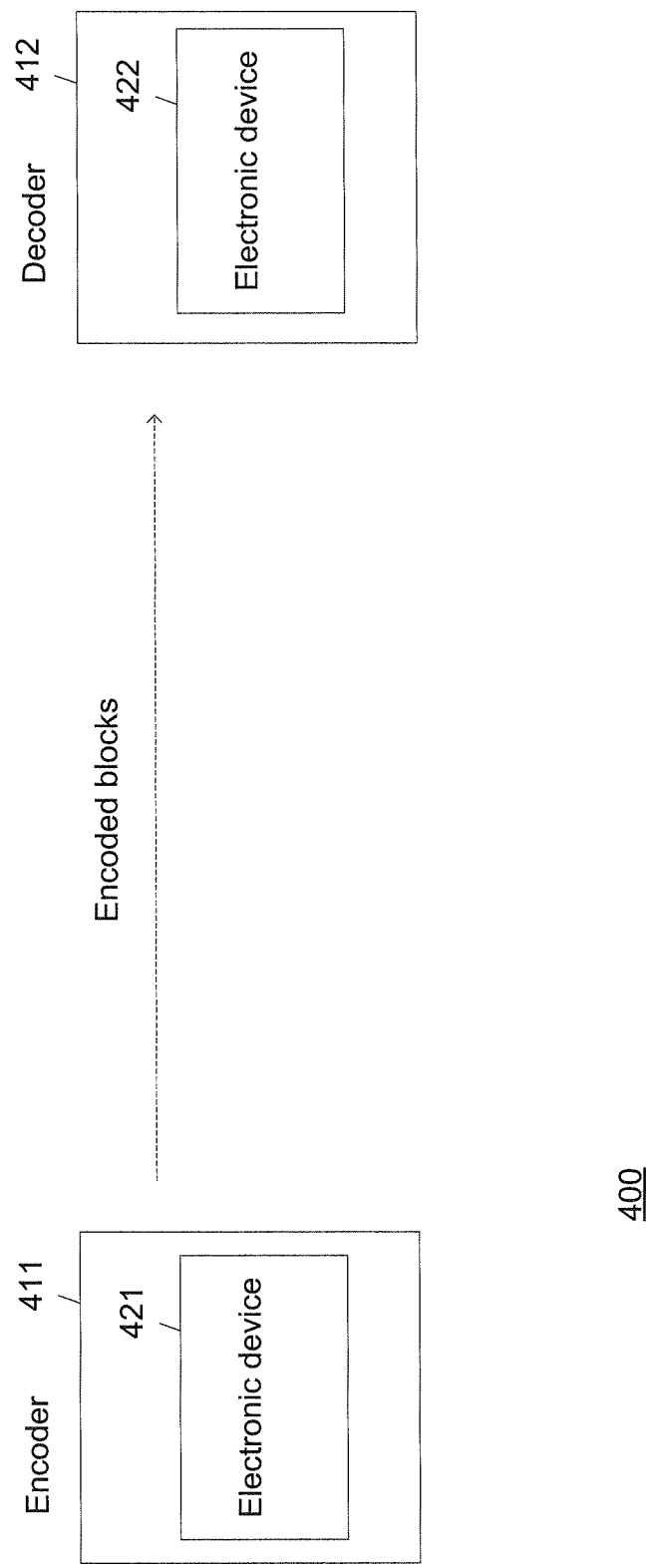
FIG. 4 is a block diagram illustrating an example of an encoder and a decoder.

FIG. 4 is a block diagram illustrating an example of an encoder and a decoder.

The system 400 includes an encoder 411 to generate encoded blocks to be decoded by a decoder 412. The encoder 411 and the decoder 412 may communicate over a network.

The encoder 411 includes an electronic device 421 configured to encode using high throughput binarization mode. The electronic device 421 may comprise a processor and memory in electronic communication with the processor, where the memory stores instructions being executable by the processor to perform the operations shown in FIGS. 5 and 6.

The decoder 412 includes an electronic device 422 configured to decode using the high throughput binarization mode. The electronic device 422 may comprise a processor and memory in electronic communication with the processor, where the memory stores instructions being executable to perform the operations shown in FIGS. 7 and 8.

Figure 5:
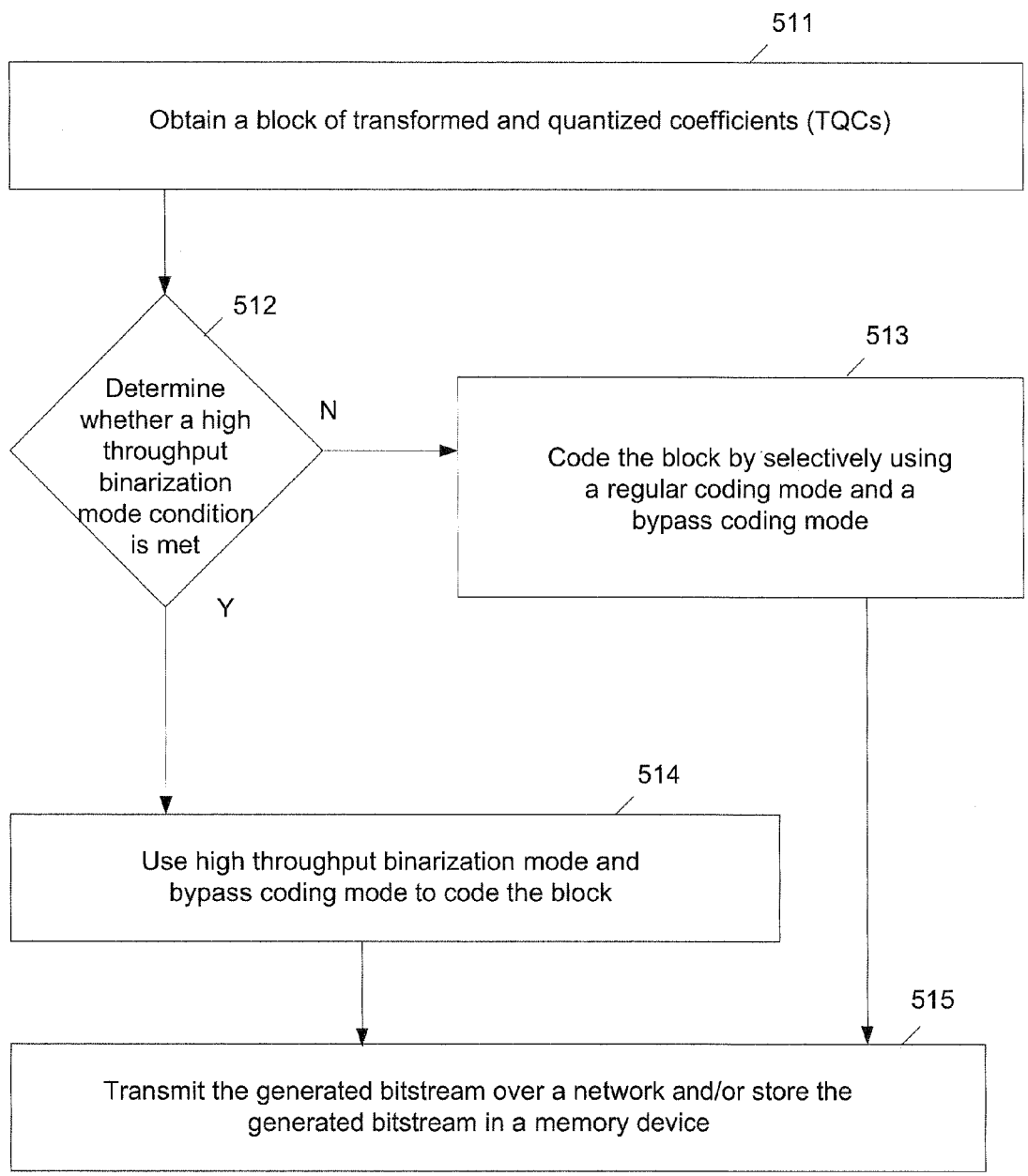
FIG. 5 is a flow diagram illustrating one configuration of a method for high throughput binarization mode on an electronic device.

FIG. 5 is a flow diagram illustrating one configuration of a method for high throughput binarization mode on an electronic device.

In block 511, the electronic device 421 obtains a block of transformed and quantized coefficients (TQCs). In diamond 512, the electronic device 421 determines whether a high throughput binarization mode condition is met. If the condition is not met in diamond 512, then in block 513 the electronic device 421 codes the block by selectively using a regular coding mode and a bypass coding mode (according to conventional CABAC selection schemes).

If the condition is met in diamond 512, then in block 514 the electronic device 421 uses high throughput binarization mode and bypass coding mode to code the block. The electronic device 421 transmits the generated bitstream over a network and/or stores the generated bitstream in a memory device in block 515.

HTB mode uses bypass coding mode for coding the level values. In contrast to regular encoding mode, bypass coding omits the computationally expensive context estimation and probability update stages because bypass coding mode assumes a fixed probability distribution for the input bins.

In addition to using bypass coding mode for coding, by way of contrast to conventional CABAC, HTB mode uses simplified signing structure for coding. For example, conventional CABAC requires four sub-parts for coding, including Greater_than_1, Greater_than_2, Sign information, and Absolute-3.

Figure 6:
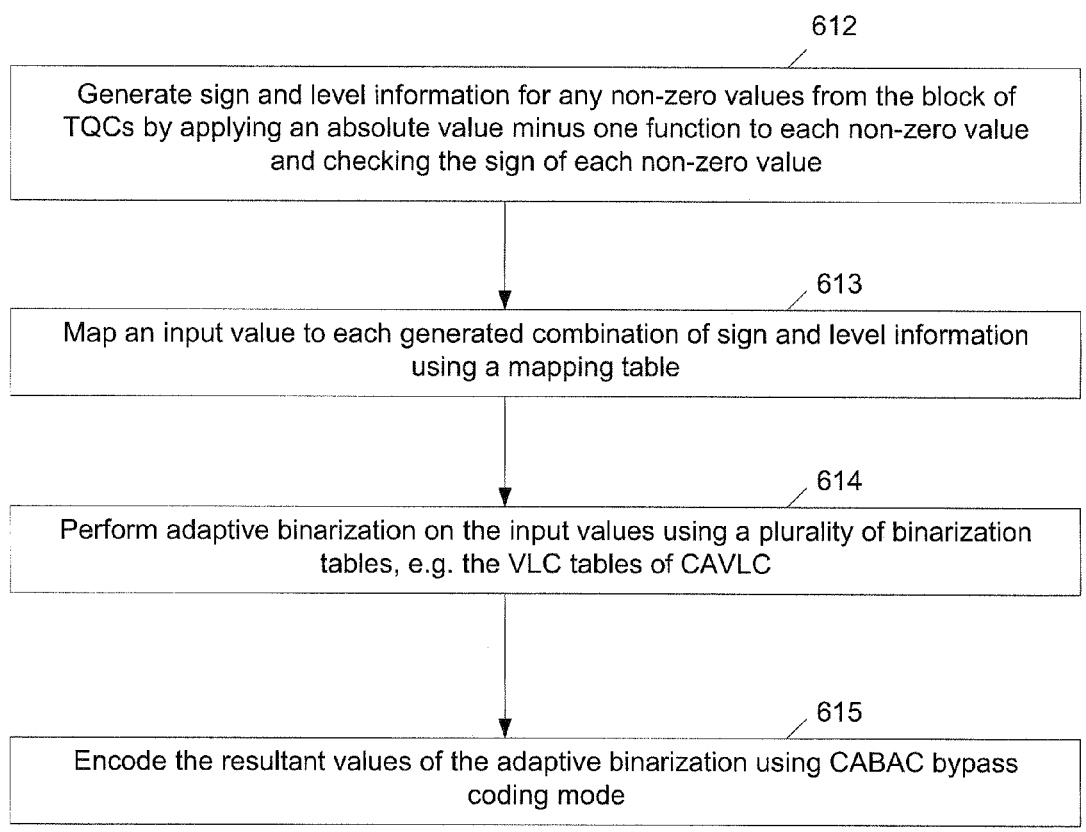
FIG. 6 is a flow diagram illustrating one configuration of encoder processing using high throughput binarization mode.

FIG. 6 is a flow diagram illustrating one configuration of encoder processing using high throughput binarization mode.

The blocks 612-615 illustrate operations performed in block 514 in more detail. In block 612, the electronic device 421 generates sign and level information for any non-zero values from the block of TQCs by applying an absolute value minus one function to each non-zero value and checking the sign of each non-zero value. For ease of explanation, consider the values for the 1D arrayed TQC from the background section of the present application [4, 0, 3, −3, 2, 1, 0, −1, 0, . . . ]. Applying the absolute value minus one function to each non-zero value and checking the sign of each non-zero value generates six combinations of sign and level information as follows: +3, +2, −2, +1, +0, and −0.

In block 613, the electronic device 421 maps an input value to each generated combination of sign and level information using a mapping table. An example mapping table is shown in FIG. 9. FIG. 9 also shows an equation for determining an input value according to blocks 612 and 613.

In block 614, the electronic device 421 performs adaptive binarization of the input values using a plurality of binarization tables, e.g. the VLC tables of Context Adaptive Variable Length Coding (CAVLC). An example of the VLC tables of CAVLC is shown in FIG. 10. FIG. 10 also shows an equation for updating the binarization tables based on previous input information.

In an example, block 614 may include initially using values from the column VLC-Table-0 (FIG. 10) to binarize at least the first input value. The VLC table number may be monotomically increased when a previous value is larger than the given threshold values, e.g. 3, 5, 13, 27. Accordingly, subsequent adaptive binarization after the first monotomical increase may use values from the column VLC-Table-1, subsequent adaptive binarization after the second monotomical increase may use values from the column VLC-Table-2, etc.

In block 615, the electronic device 421 encodes the resultant values of the adaptive binarization using the CABAC bypass coding mode.

High Throughput Binarization Mode Condition

In an example, if a characteristic corresponding to a block of image data is greater than a preset threshold, then the high throughput binarization mode condition is met, e.g. the electronic device 421 may set a high throughput binarization mode indicator, e.g. an HTB mode flag, to a value of 1 (which of course may include changing a default value of the HTB mode flag or leaving the HTB mode flag at a default value depending on design preference).

In an example, the electronic device 421 determines whether a bit rate for a coding is greater than a preset threshold. If the bit rate is greater than the preset threshold, then the high throughput binarization mode condition is met. In an example, the preset bit rate threshold corresponds to QP 16; however, a preset threshold corresponding to different QP values may be used.

In an example, the determination (by the electronic device 421 or the electronic device 422) of whether the high throughput binarization mode condition is met is based on whether the transform unit level (for example but not limited to the level values generated by a transform unit) of a corresponding block of image data is greater than a preset threshold.

In an example, the high throughput binarization mode condition can be met when the number of level values of a corresponding block of image data and with magnitude greater than zero is greater than a preset threshold, e.g. 8. In another example, the high throughput binarization mode condition is met when the number of level values of a corresponding block of image data and with magnitude greater than a first preset threshold is greater than a second preset threshold. In yet an example, the high throughput binarization mode condition is met when a level value of a corresponding block of image data is greater than a preset threshold.

Figure 20A:
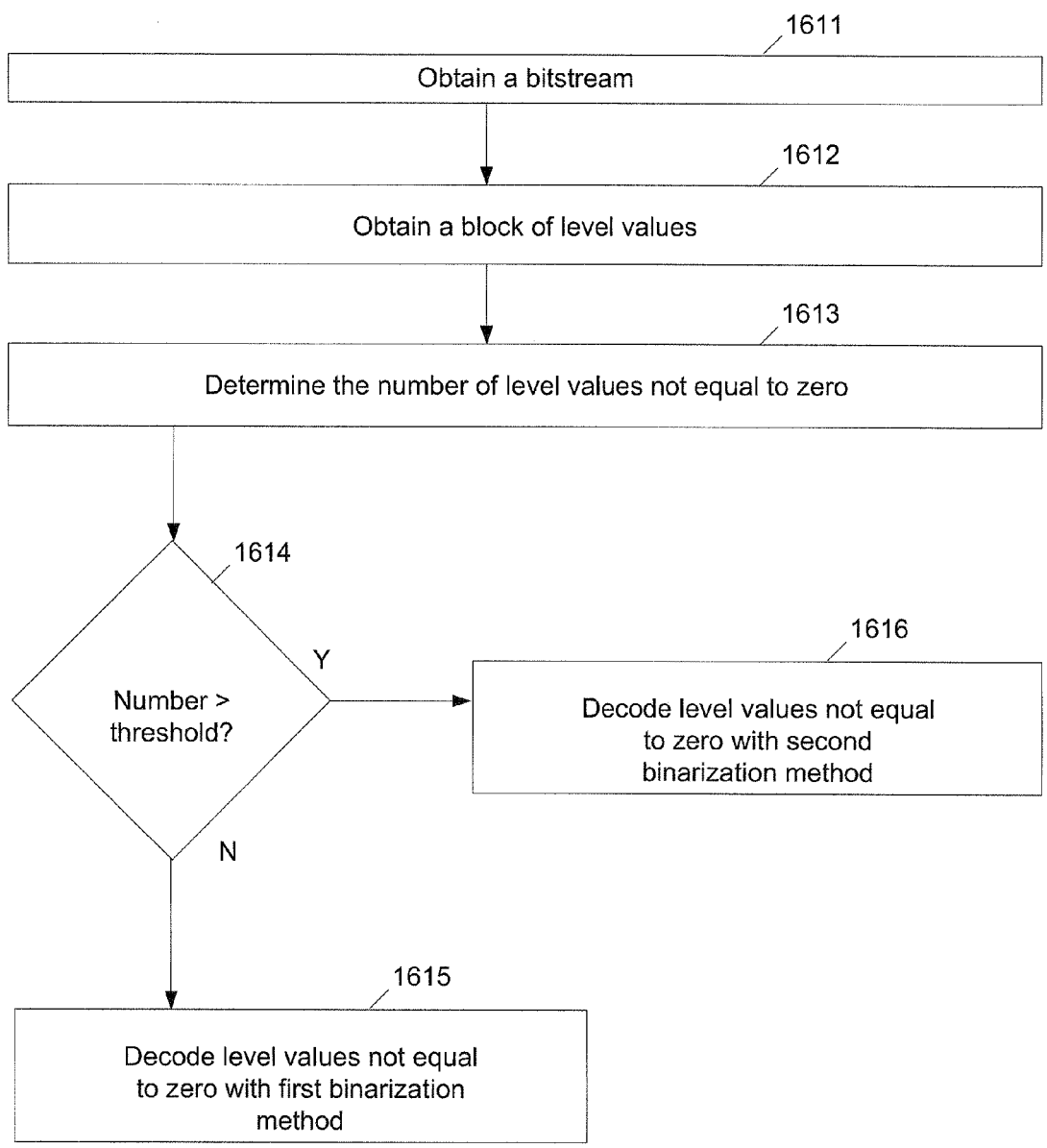
FIGS. 20A-E are flow diagrams illustrating example configurations of an encoder or a decoder to determine whether the high throughput binarization mode condition is met.
Figure 20B:
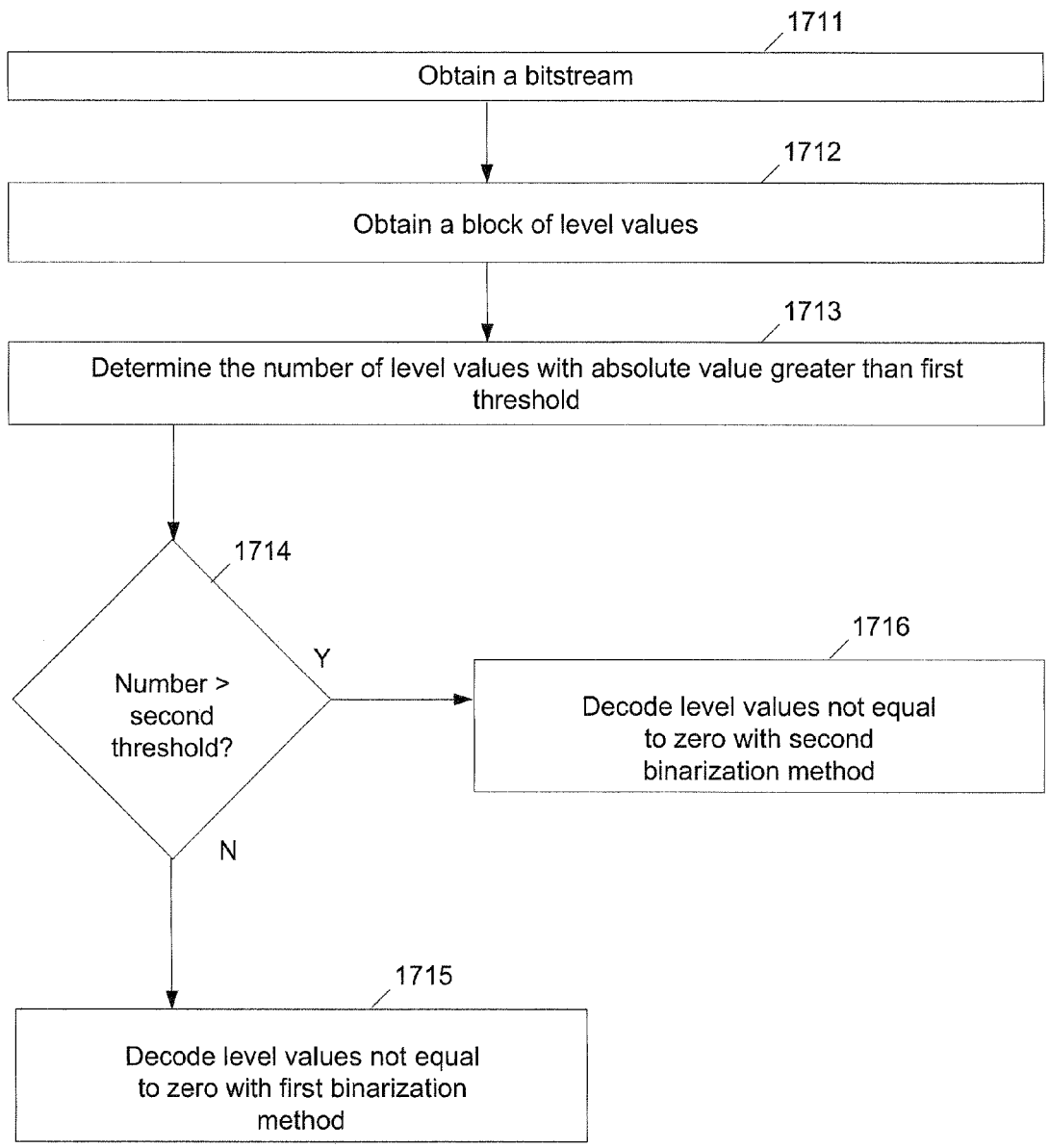
Figure 20C:
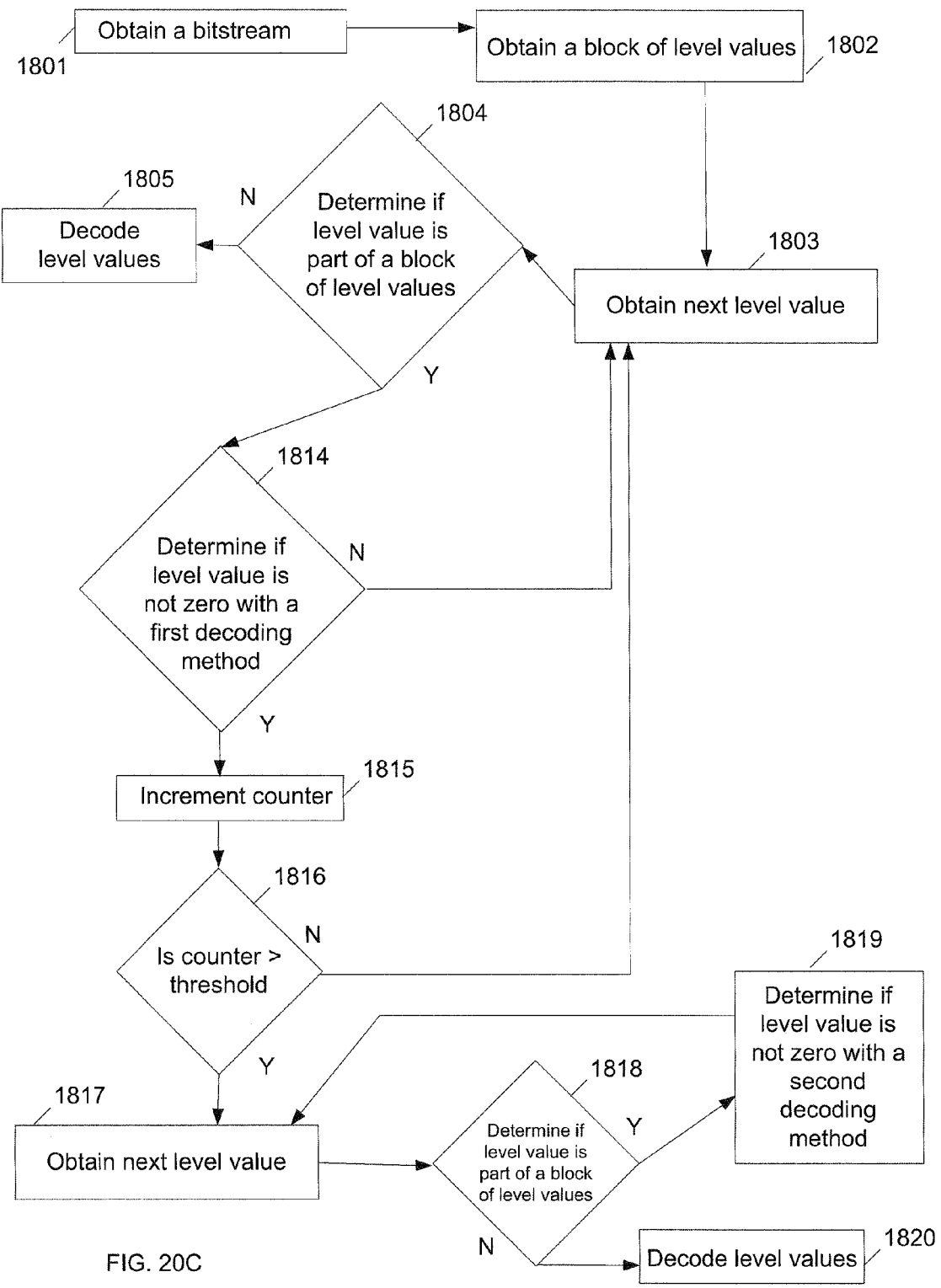
Figure 20D:
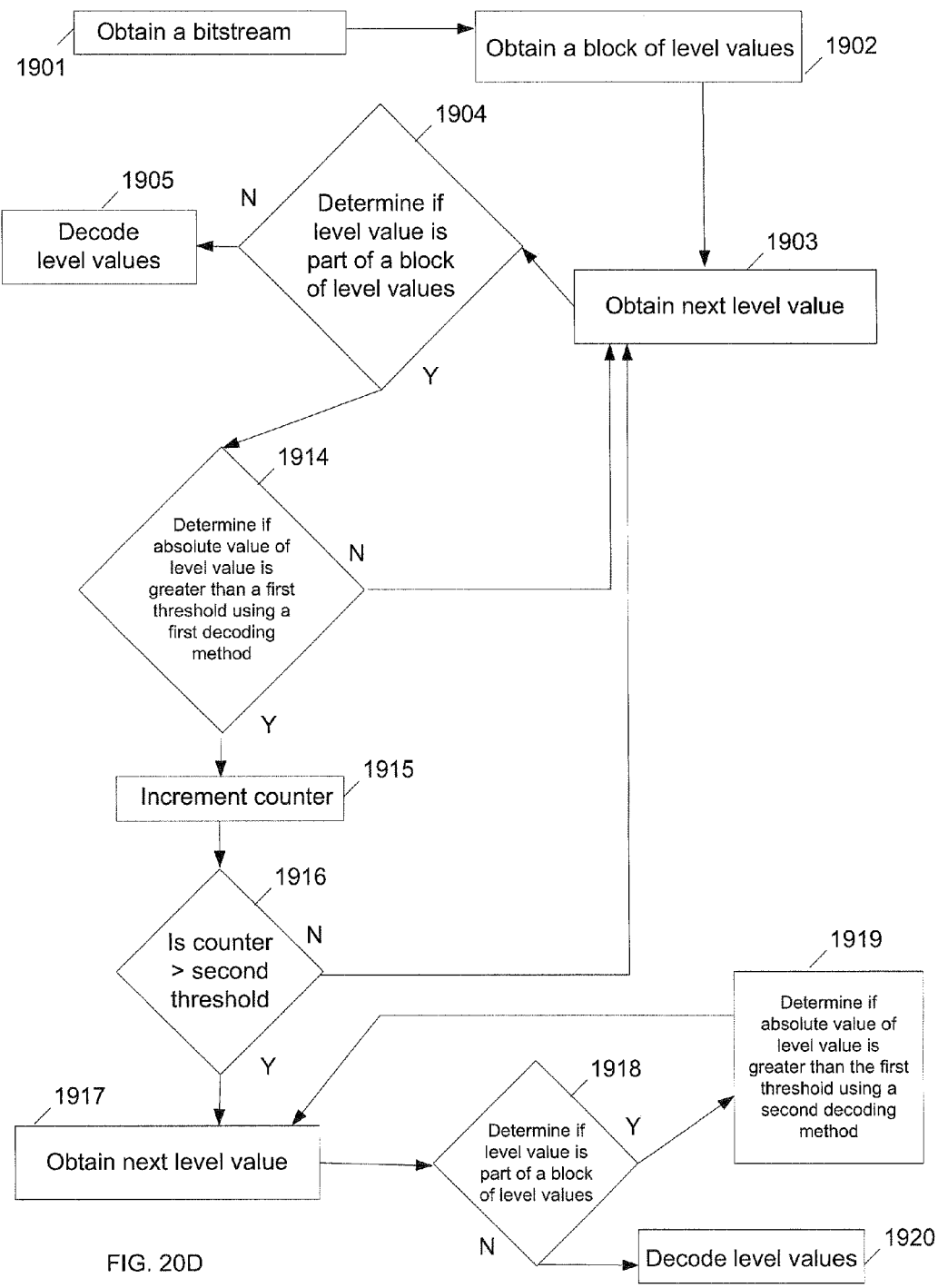
Figure 20E:
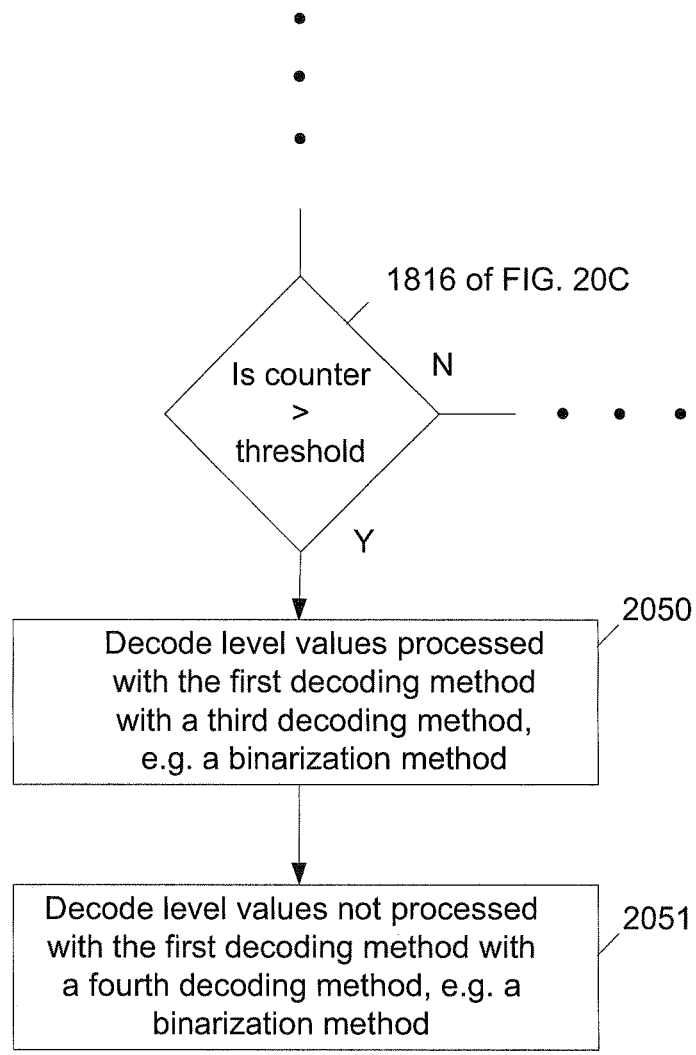

The FIGS. 20A-E show some examples of configurations that may be used for an encoder or decoder in example systems operating according to at least some of the principles described in the immediately preceding two paragraphs. FIG. 20A illustrates processes 1611-1616, as shown. FIG. 20B illustrates processes 1711-1716, as shown. FIG. 20C illustrates processes 1801-1805 and 1814-1820. FIG. 20D illustrates processes 1901-1905 and 1914-1920. In FIG. 20E, the processes of FIG. 20C are performed up until process 1816, as shown. If the counter is greater than the threshold in process 1816, then the configuration continues as shown in FIG. 20E.

In an example, the determination (by the electronic device 421 or the electronic device 422) of whether the high throughput binarization mode condition is met is based on whether the slice level of a corresponding block of image data is greater than a preset threshold.

High Throughput Binarization Mode Indicator

In an example, the electronic device 421 is configured to set a high throughput binarization indicator, e.g. an HTB mode flag, in a header, e.g. the slice header. The high throughput binarization indicator may be used to determine whether or not the process shown in FIG. 5 is executed for block(s) corresponding to the slice header.

In an example, setting the HTB mode flag to "1" causes the electronic device 421 to perform the process shown in the flowchart of FIG. 5 for block(s) corresponding to the slice header in response to observing the HTB mode flag value of "1". Setting the HTB mode flag to "0" causes the electronic device 421 to encode block(s) corresponding to the slice header according to a conventional CABAC technique in response to observing the HTB mode flag value of "0".

The HTB mode flag value may also be observed by the electronic device 422 for decoding. In an example, the electronic device 422 decodes block(s) corresponding to a slice header having the HTB mode flag value of "1" according to the process shown in the flowchart of FIG. 7 for block(s) corresponding to the slice header in response to observing the HTB mode flag value of "1". The electronic device 422 decodes block(s) corresponding to a slice header having the HTB mode flag value of "0" according to a conventional CABAC technique in response to observing the HTB mode flag value of "0".

Figure 7:
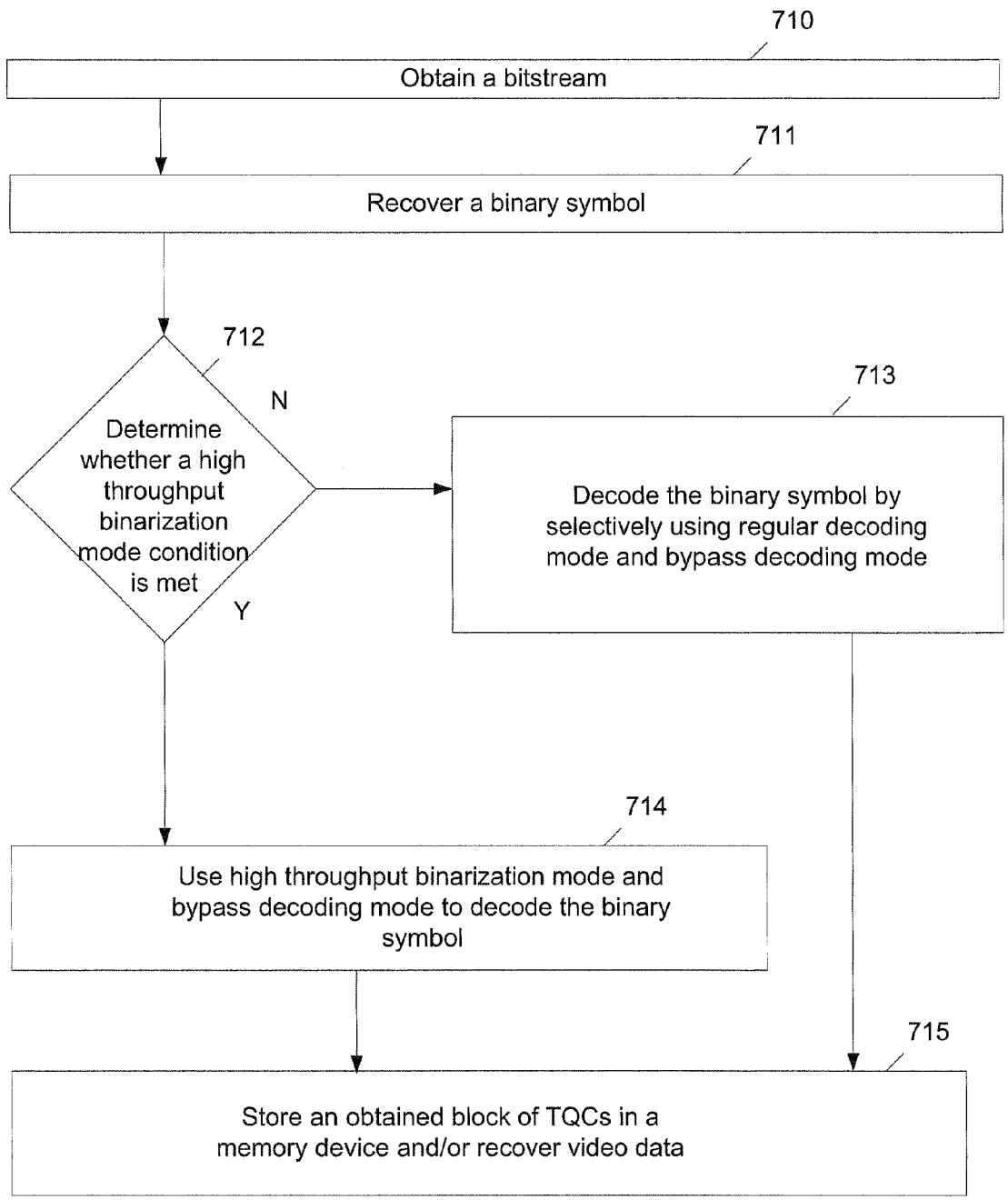
FIG. 7 is a flow diagram illustrating one configuration of a method for high throughput binarization mode on an electronic device at the decode-side.

FIG. 7 is a flow diagram illustrating one configuration of a method for high throughput binarization mode on an electronic device at the decode-side.

In block 710, the electronic device 422 obtains a bitstream. In block 711, the electronic device 422 recovers a binary symbol from the obtained bitstream.

In diamond 712, the electronic device 422 determines whether a high throughput binarization mode condition is met. In an example, the determination may include checking a header, such as a slice header, corresponding to the received bitstream. Checking the header may further comprise checking a slice header corresponding to the obtained bit stream for a value of a high throughput binarization mode indicator. If the condition is not met in diamond 712, then in block 713 the electronic device 422 decodes the binary symbol by selectively using regular decoding mode and bypass coding mode.

If the condition is met in diamond 712, then in block 714 the electronic device 421 uses high throughput binarization mode and bypass decoding mode to decode the binary symbol. The electronic device 422 may store an obtained block of TQCs in a memory device and/or may recover video data in block 715.

Figure 8:
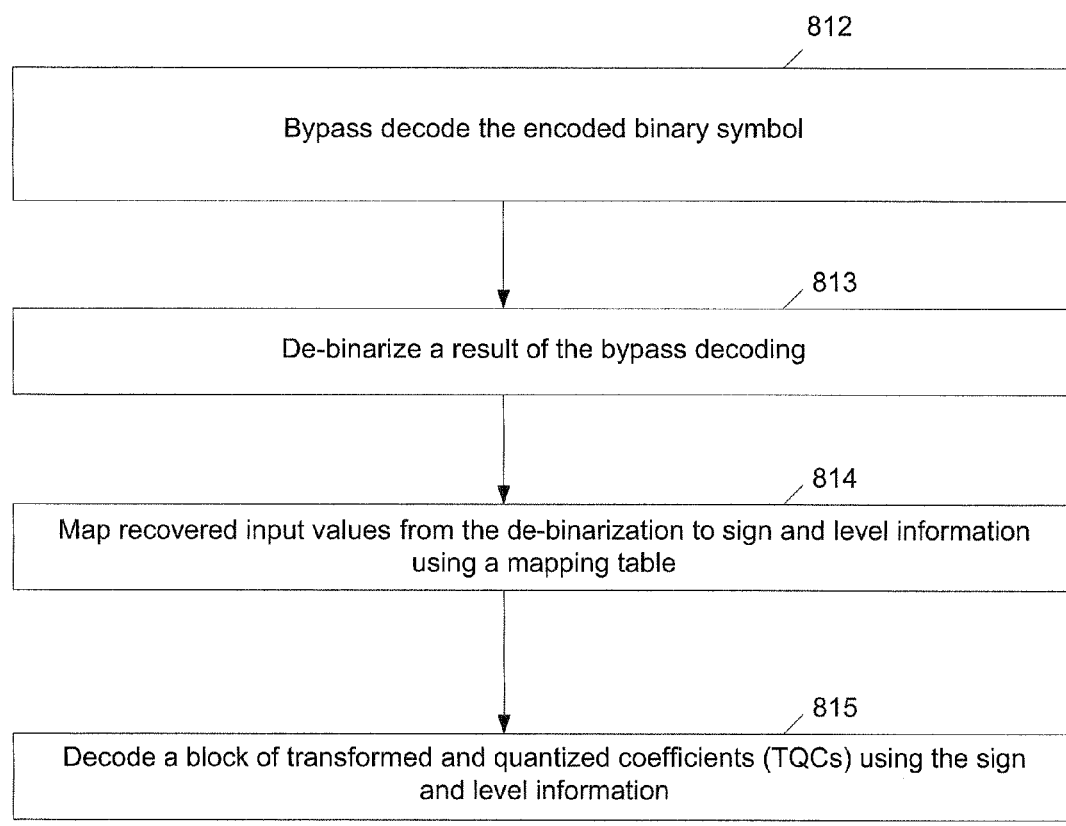
FIG. 8 is a flow diagram illustrating one configuration of decoder processing using high throughput binarization mode.

FIG. 8 is a flow diagram illustrating one configuration of decoder processing using high throughput binarization mode.

The blocks 812-815 illustrate operations performed in block 714 in more detail. In block 812, the electronic device 422 bypass decodes the encoded binary symbol. In block 813, the electronic device 422 de-binarizes a result of the bypass decoding. In block 814, the electronic device 422 maps recovered input values from the de-binarization to sign and level information using a mapping table. In block 815, the electronic device 422 decodes a block of transformed and quantized coefficients (TQCs) using the sign and level information.

In an example, an electronic device including a processor and a memory in electronic communication with the processor is provided. Stored in the memory are instructions executable by the processor to perform operations.

In an example, an operation may include obtaining a block of transformed and quantized coefficients (TQCs). Another operation may include determining whether a high throughput binarization mode condition is met. Another operation may include generating a first bitstream using the high throughput binarization mode in response to determining that the high throughput binarization mode condition is met. Another operation may include generating a second bitstream in response to determining that the high throughput binarization mode condition is not met. Another operation may include transmitting the generated first or second bitstream to a decoder.

In an example, the generation of the first bitstream using the high throughput binarization mode may include additional operations. One operation may include generating sign and level information for any non-zero values from the block by applying an absolute value minus one function to each non-zero value and checking the sign of each non-zero value. Another operation may include mapping an input value to each generated combination of sign and level information using a mapping table. Another operation may include performing adaptive binarization of the mapped input values using a plurality of binarization tables. Another operation may include encoding a result of the adaptive binarization.

In an example, the plurality of binarization tables include VLC tables of CAVLC. Encoding the result of the adaptive binarization may further include the operation of utilizing a CABAC bypassing coding mode.

In an example, the adaptive binarization of the mapped input values using a plurality of binarization tables may include additional operations. One operation may include determining whether one of the mapped input values is greater than a preset threshold. Another operation may include performing a table update responsive to determining that said mapped input value is greater than the preset threshold. In an example, table update selection comprises selection of a table from a set of tables.

In an example, the generation of the first bitstream may include additional operations. One operation may include coding the block by selectively utilizing a regular coding mode and a bypass coding mode according to CABAC. Another operation may include generating the first bitstream utilizing only the bypass coding mode.

In an example, the determination of whether the high throughput binarization mode condition is met is based on whether a characteristic corresponding to a block of image data is greater than a preset threshold.

In an example, the determination of whether the high throughput binarization mode condition is met is based on whether the slice level of a corresponding block of image data is greater than a preset threshold.

In an example, the determination of whether the high throughput binarization mode condition is met is based on whether the transform unit level of a corresponding block of image data is greater than a preset threshold.

Lossless Coding Technique for CABAC in HEVC

Figure 12:
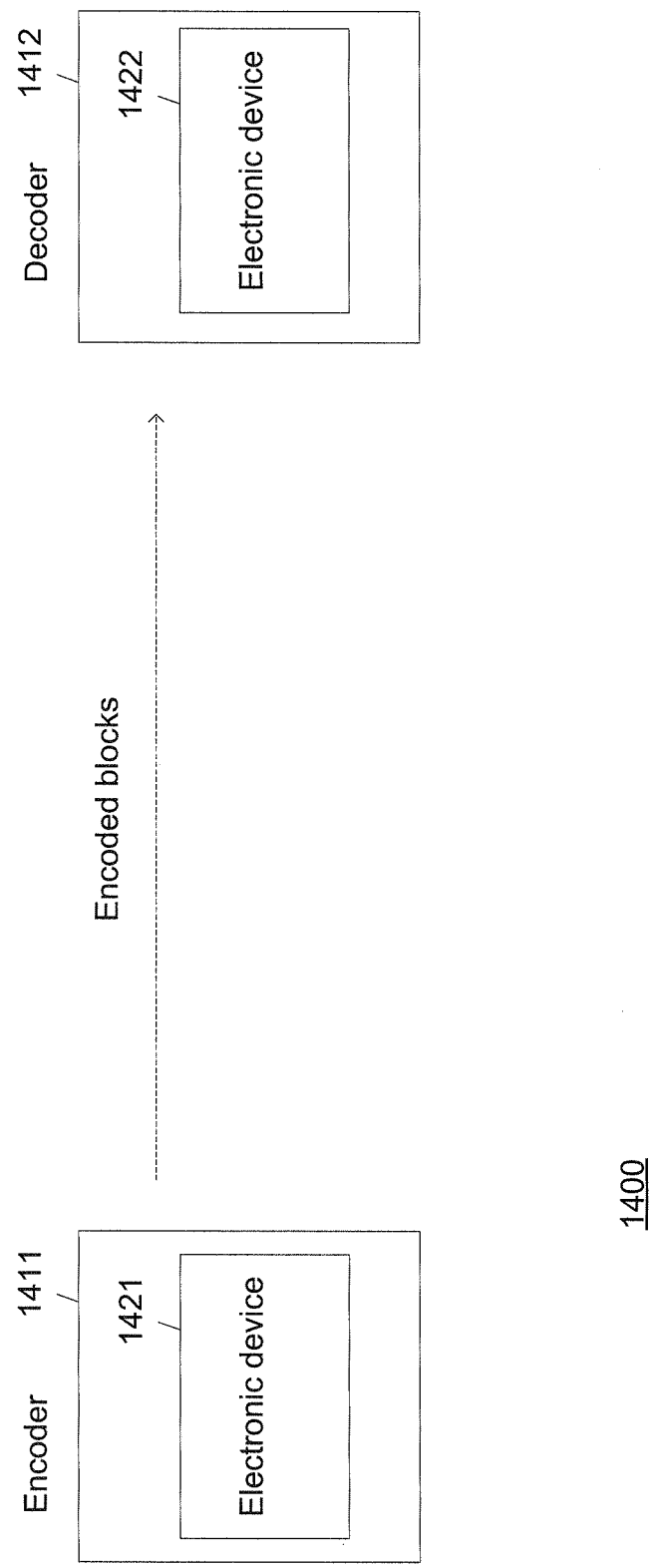
FIG. 12 is a block diagram illustrating an example of an encoder and a decoder for a lossless coding technique.

FIG. 12 is a block diagram illustrating an example of an encoder and a decoder for a lossless coding technique.

The system 1400 includes an encoder 1411 to generate encoded blocks to be decoded by a decoder 1412. The encoder 1411 and the decoder 1412 may communicate over a network.

The encoder 1411 includes an electronic device 1421 configured to encode using a lossless coding technique for CABAC in HEVC. The electronic device 1421 may comprise a processor and memory in electronic communication with the processor, where the memory stores instructions being executable by the processor to perform the operations shown in FIGS. 13, 16, and 18.

The decoder 1412 includes an electronic device 1422 configured to decode using a lossless coding technique for CABAC in HEVC. The electronic device 1422 may comprise a processor and memory in electronic communication with the processor, where the memory stores instructions being executable to perform the operations shown in FIGS. 15, 17, and 19.

Figure 13:
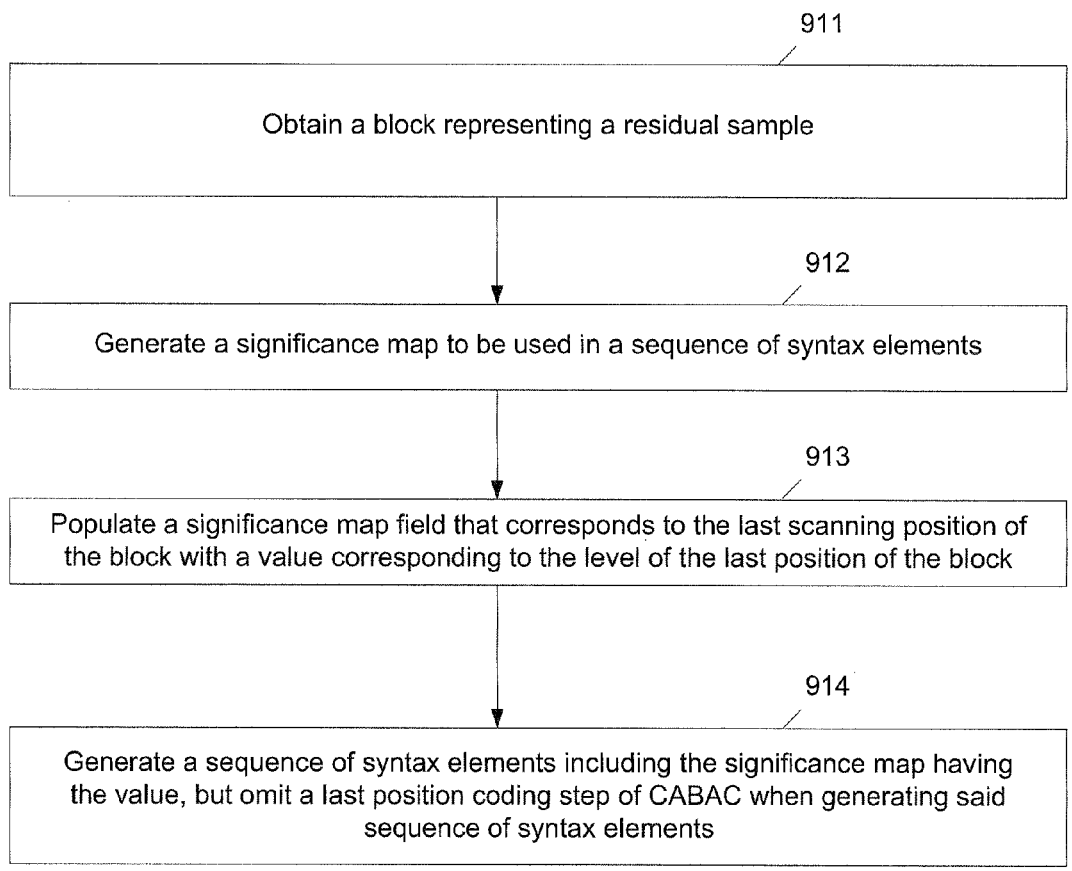
FIG. 13 is a flow diagram illustrating one configuration of a method for lossless coding on an electronic device.

FIG. 13 is a flow diagram illustrating one configuration of a method for lossless coding on an electronic device.

In block 911, the electronic device 1421 obtains a block representing a residual sample. In one example, zig-zag scanning direction may be redefined to fit the direction of intra prediction that is used to remove the spatial redundancies between neighboring pixels. There are several intra prediction modes available in lossless intra coding mode. In one example, in vertical intra prediction mode, upper pixels become the prediction value of the current pixel value and the difference between the current value and the prediction value (upper pixel value in vertical mode) become the residual sample value. Context model selection may also depend on the direction of intra prediction and the corresponding block size.

In block 912, the electronic device 1421 generates a significance map to be used in a sequence of syntax elements. In block 913, the electronic device 1421 populates a significance map field that corresponds to the last scanning position of the block with a value corresponding to the level of the last position of the block.

In block 914, the electronic device 1421 generates a sequence of syntax elements including the significance map having said value. Generating the sequence of syntax elements excludes the last position coding step of conventional CABAC lossless coding mode.

Figure 14:
FIG. 14 is a table showing a sequence of syntax elements according to the configuration illustrated in FIG. 13.

FIG. 14 is a table showing a sequence of syntax elements according to the configuration illustrated in FIG. 13.

Several differences can be observed by way of contrast of the sequence of syntax elements shown in FIG. 14 as compared to the sequence of syntax elements shown in FIG. 11. The sequence of syntax elements shown in FIG. 11 includes a Last_position_X field and a Last_position_Y field because the conventional CABAC lossless coding mode includes a last position coding step. In contrast, the sequence of syntax elements shown in FIG. 14 does not include a Last_position_X field and a Last_position_Y field because the configuration of FIG. 14 omits the last position coding step.

While both of the sequence of syntax elements include significance maps, there are differences between the significance maps. In the significance map of the sequence of syntax elements of FIG. 11, a significance map field is unpopulated to correspond with the field of Last_position_X/Last_position_Y that is populated. In contrast, in FIG. 14 a significance map field that corresponds to the last scanning position of the block is populated with a value, i.e. "0" for the example block, corresponding to the level of the last position of the block.

Figure 15:
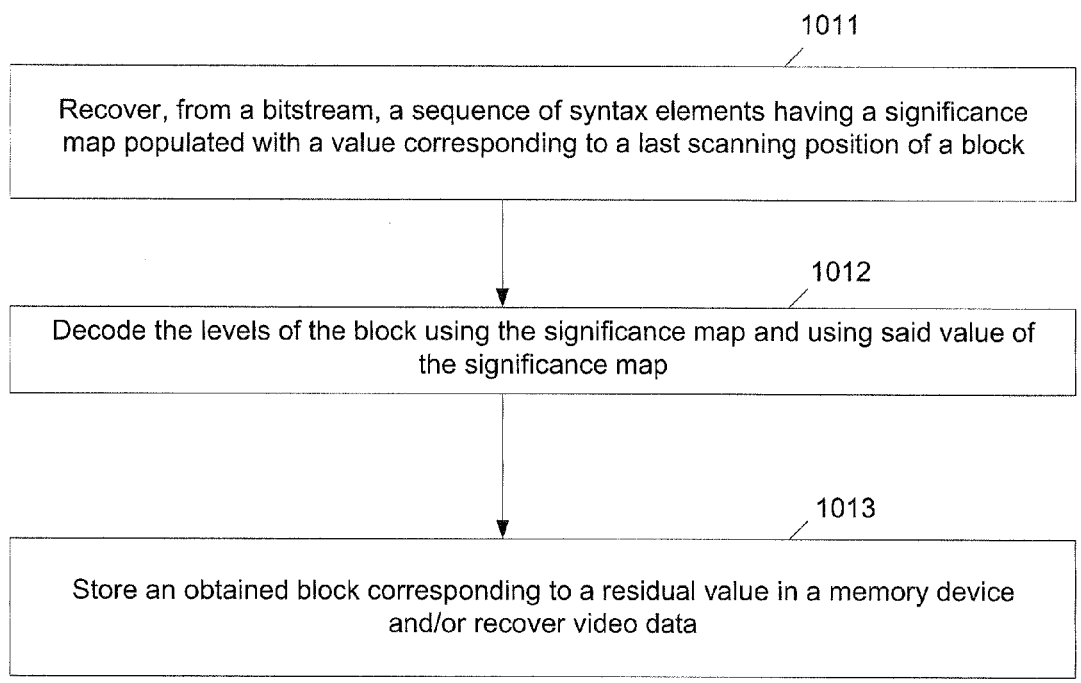
FIG. 15 is a flow diagram illustrating one configuration of a method for lossless decoding on an electronic device at the decode-side.

FIG. 15 is a flow diagram illustrating one configuration of a method for lossless decoding on an electronic device at the decode-side.

In block 1011, the electronic device 1422 recovers, from a bitstream, a sequence of syntax elements having a significance map field containing a number of values corresponding to a last scanning position of a block. In block 1012, the electronic device 1422 decodes the levels of the block using the significance map and using said value of the significance map. In block 1013, the electronic device 1422 stores an obtained block corresponding to a residual value in a memory device and/or recovers video data.

Figure 16:
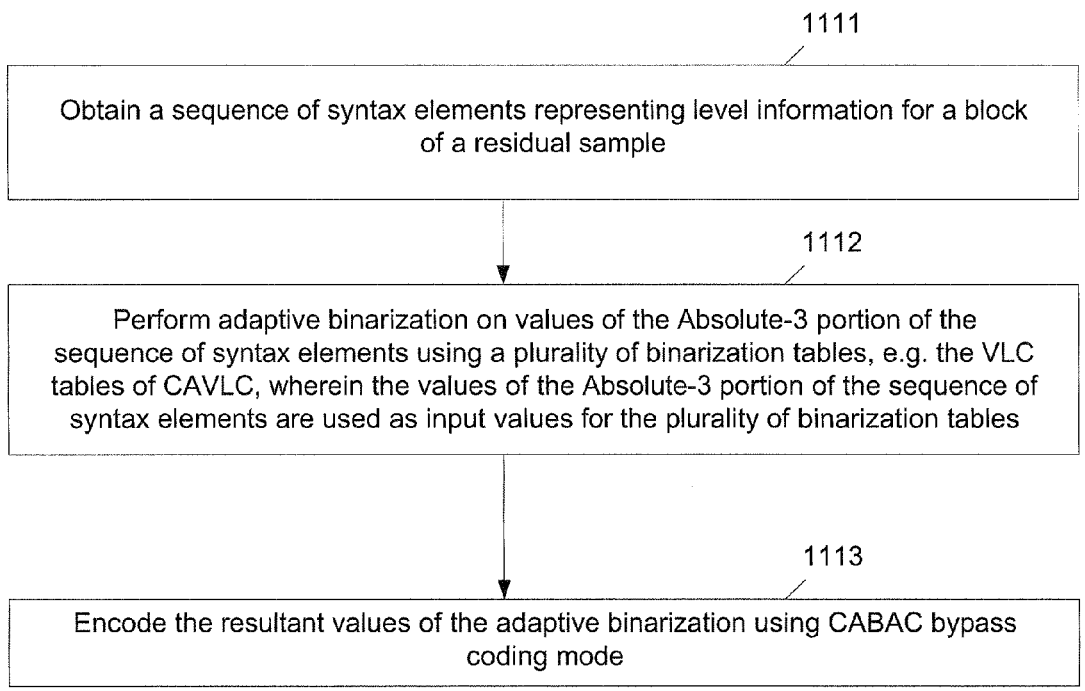
FIG. 16 is a flow diagram illustrating another configuration of a method for lossless coding on an electronic device.

FIG. 16 is a flow diagram illustrating another configuration of a method for lossless coding on an electronic device.

In block 1111, the electronic device 1421 obtains a sequence of syntax elements representing level information for a block of a residual sample. In block 1112, the electronic device 1421 performs adaptive binarization on values of the Absolute-3 portion of the sequence of syntax elements using a plurality of binarization tables, e.g. the VLC tables of CAVLC (FIG. 10), wherein the values of the Absolute-3 portion of the sequence of syntax elements are used as input values for the plurality of binarization tables. An equation for updating the binarization tables based on previous input information is shown below:

if ('abs[coefficient(i)]−3'>(Table[vlc])) vlc++;
where Table [vlc]={3,5,13,27};
'i' represents scanning position and 'vlc' represents the current vlc table number
*vlc is first set to zero (or one for intra slice) because there is no available previous 'Absolute-3' vlc Table updated is stopped when vlc is equal to 4

In an example, block 1111 may include initially using values from the column VLC-Table-0 (FIG. 10) for inter slice and the column VLC-Table-1 for intra slice to binarize at least the first input value. The VLC table number may be monotomically increased when a previous value is larger than the given threshold values, e.g. 3, 5, 13, 27. Accordingly, subsequent adaptive binarization after the first monotomical increase may use values from the column VLC-Table-1, subsequent adaptive binarization after the second monotomical increase may use values from the column VLC-Table-2, etc.

In block 1113, the electronic device 1421 encodes the resultant values of the adaptive binarization using CABAC bypass coding mode.

Figure 17:
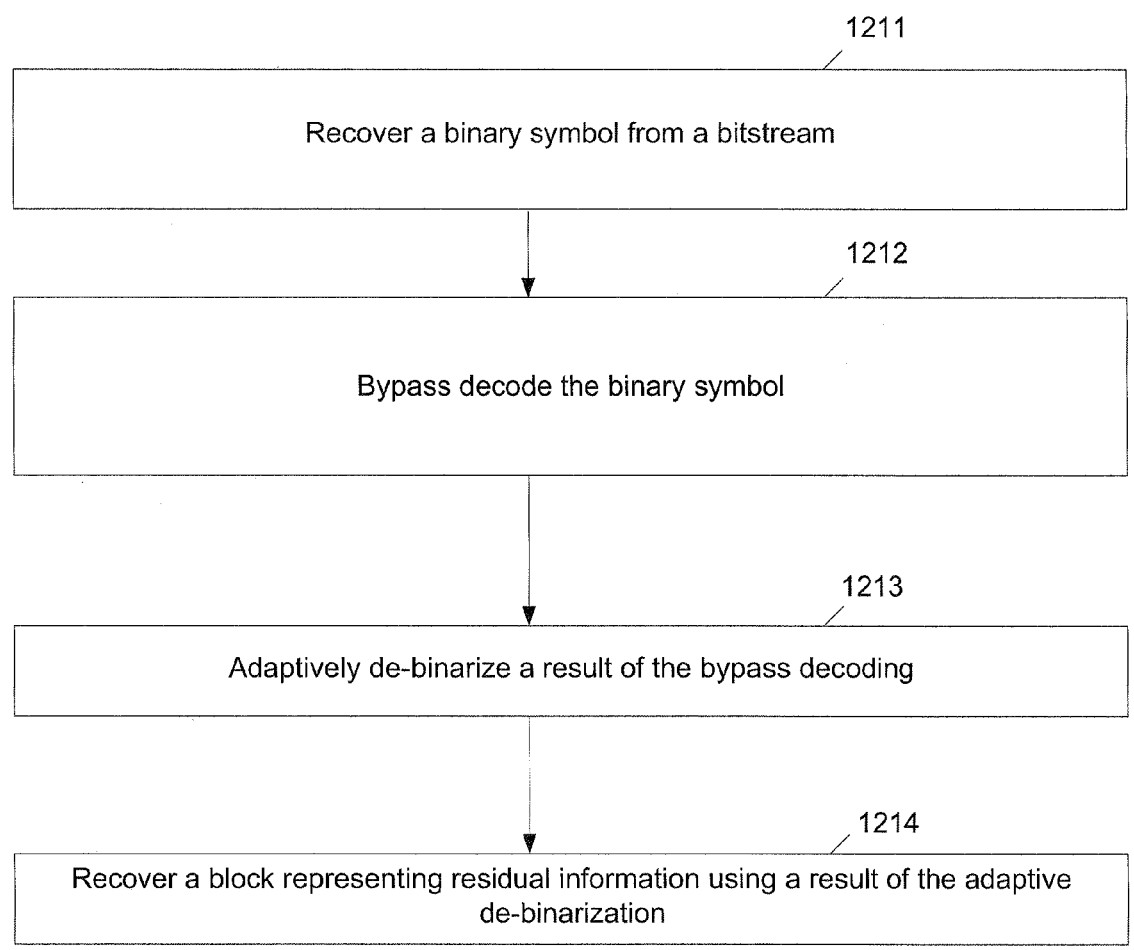
FIG. 17 is a flow diagram illustrating another configuration of a method for lossless coding on an electronic device at the decode-side.

FIG. 17 is a flow diagram illustrating another configuration of a method for lossless coding on an electronic device at the decode-side.

In block 1211, the electronic device 1422 recovers a binary symbol from a bitstream. In block 1212, the electronic device 1422 bypass decodes the binary symbol. In block 1213, the electronic device 1422 adaptively de-binarizes a result of the bypass decoding. In block 1214, the electronic device 1422 recovers a block representing residual information using a result of the adaptive de-binarization.

Figure 18:
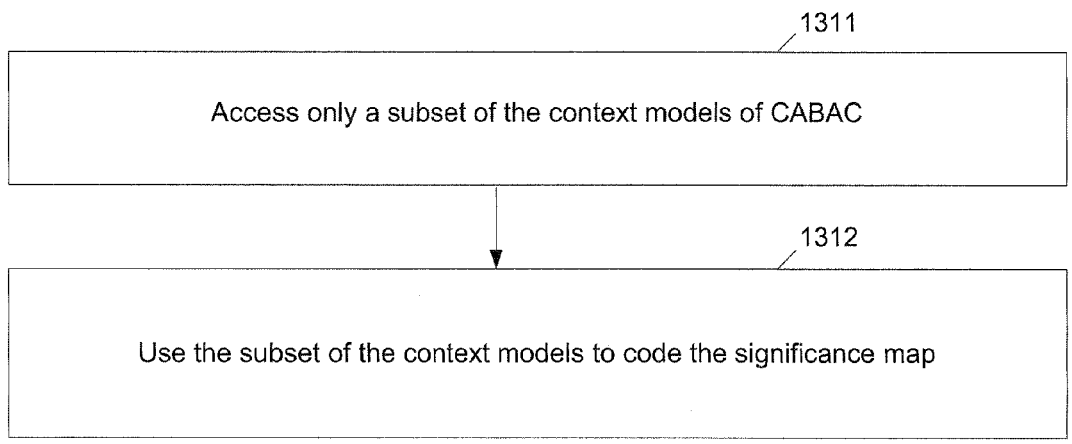
FIG. 18 is a flow diagram illustrating yet another configuration of a method for lossless coding on an electronic device.

FIG. 18 is a flow diagram illustrating yet another configuration of a method for lossless coding on an electronic device.

In block 1311, the electronic device 1421 accesses only a subset of the context models of CABAC. The number of context models of CABAC may be 184. In order to generate the subset, these context models may be filtered based on associated characteristics of the context models, e.g. based on which context models are associated with a frequency component, based on which context models are associated with a scan position, based on which context models are associated with the last position coding step of CABAC, or the like, or any combination thereof. The filtering may be performed by the electronic device 1421 in one example, but in other examples the subset may be provided to the electronic device 1421 so that the electronic device 1421 may access the provided subset for lossless coding mode. In an example, in order to generate the subset, the context models of CABAC may be classified based on associated characteristics of the context models, e.g. based on which context models are associated with to frequency component, based on which context models are associated with a scan position, based on which context models are associated with the last position coding step of CABAC, or the like, or any combination thereof. In an example, frequency component and scan position may be equal and interchangeable.

In one example, a subset may not contain CABAC context models with a frequency component not equal to a first frequency component. In an example, the resulting subset would include 26 context models, i.e. two context models (one is for a first luma frequency component and the other is for a first chroma frequency component) for coding the significance map, and 6 context models for coding the first luma frequency component of the Greater_than__1 flag, coding the first chroma frequency component of the Greater_than__1 flag, coding the first luma frequency component of the Greater_than__2 flag of luma, and coding the first chroma frequency component of the Greater_than__2 flag, respectively. Therefore, total 24 context models are used for Greater_than__1 and Greater_than__2. In an example, said first frequency component is only accessed when coding the significance map in block 1312.

As shown In Table (3), the 6 context models for coding the first luma frequency of a flag may depend on the sub-block type and the LargerT1 value, where the LargerT1 value is the number of coefficient level values greater than one in the previous sub-block. In an example, the term "sub-block" refers to a partitioning of the residual samples (or block to TQCs). For example, for a sub-block size of 4×4, residual sample with a size of 8×8 are divided into four 4×4 sub-blocks. Similarly, for a sub-block size of 8×4, residual samples with a size of 32×8 are divided into eight 8×4 sub-blocks. Sub-blocks are identified by coding order, where sub-block 0 denotes the first coded sub-block. In an example, the first coded sub-block is the sub-block located at the bottom right of the block. In another example, the first coded sub-block is the sub-block located in the middle of the block.

TABLE (3)

6 context models based on sub-block type and LargerT1

| | | |
|---|---|---|
| 0 | Sub-block 0 | 0 LargerT1 in previous subset |
| 1 | | 1-3 LargerT1 in previous subset |
| 2 | | >3 LargerT1 in previous subset |
| 3 | Other sub-blocks | 0 LargerT1 in previous subset |
| 4 | | 1-3 LargerT1 in previous subset |
| 5 | | >3 LargerT1 in previous subset |

In block 1312, the electronic device 1421 uses the subset of the context models to code the significance map.

As described three paragraphs earlier, context models with a frequency component (or scanning position) not equal to a first frequency component (or scanning position) may not be used in a lossless coding mode. This has the benefit of reducing computational complexity and memory for the lossless coding mode. A first subset of context models may be used for significance map processing. A second subset of context models may be used for level coding, e.g. Greater_than_1 coding and/or Greater_than_2 coding. The first subset may be different than the second subset.

In an example applying at least some of the principles described above, the first subset of context models used in significance map processing may comprise only one context model. In another example applying at least some of the principles described above, the first subset of context models used in significance map processing may comprise more than one context model, e.g. two or three context models, based on color information (luma/chroma). In yet another example applying at least some of the principles described above, the first subset of context models used in significance map processing may comprise more than one context model, e.g. several context models, based on prediction type, e.g. the use of intra-frame or inter-frame prediction within a block. In another example applying at least some of the principles described above, the first subset of context models used in significance map processing may comprise more than one context model, e.g. two or three context models, based on block size. In another example applying at least some of the principles described above, the first subset of context models used in significance map processing may comprise more than one context model, e.g. two or three context models, based on sub-block type.

In an example applying at least some of the principles described above, the second subset of context models used in level coding may comprise only one context model. In another example applying at least some of the principles described above, the second subset of context models used in level coding may comprise more than one context model, e.g. two or three context models, based on color information (luma/chroma). In yet another example applying at least some of the principles described above, the second subset of context models used in level coding may comprise more than one context model, e.g. several context models, based on block prediction type, e.g. the use of intra-frame or inter-frame prediction within a block. In another example applying at least some of the principles described above, the first subset of context models used in level coding may comprise more than one context model, e.g. two or three context models, based on block size. In another example applying at least some of the principles described above, the first subset of context models used in level coding processing may comprise more than one context model, e.g. two or three context models, based on sub-block type.

Figure 19:
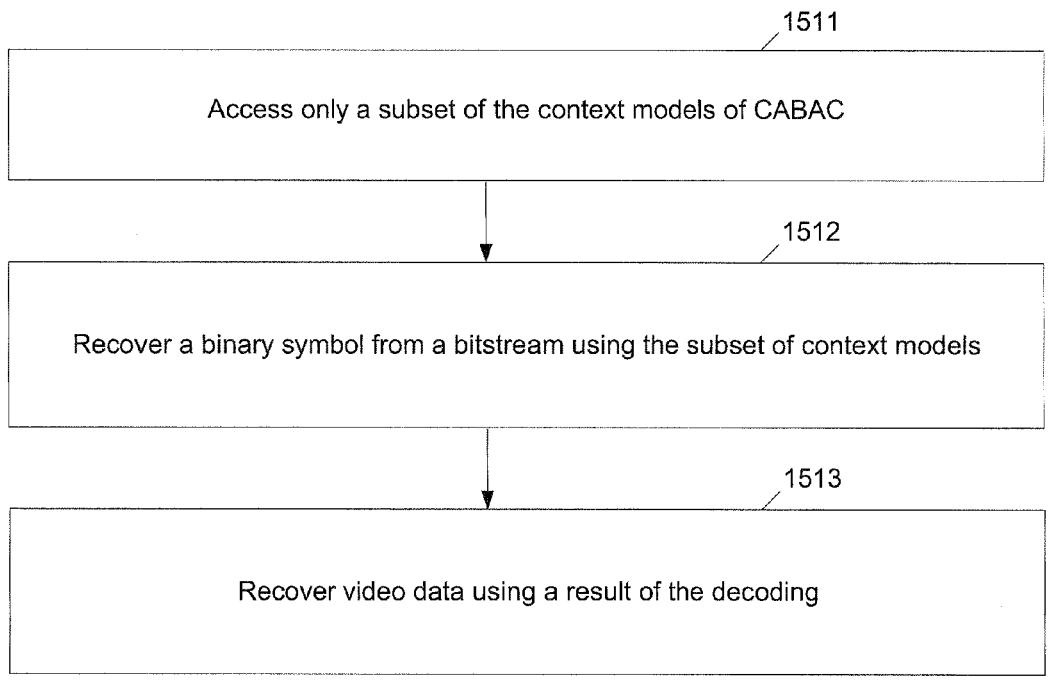
FIG. 19 is a flow diagram illustrating yet another configuration of a method for lossless coding on an electronic device at the decode-side.

FIG. 19 is a flow diagram illustrating yet another configuration of a method for lossless coding on an electronic device at the decode-side.

In block 1511, the electronic device 1422 accesses only a subset of the context models of CABAC. In block 1512, the electronic device 1422 recovers a binary symbol from a bitstream using the subset of context models. In block 1513, the electronic device 1422 recovers video data using a result of the decoding.

In the foregoing, configurations that may be implemented by the electronic device 1421 are illustrated in FIGS. 13, 16, and 18. Configuring an encoder with all of these configurations improves coding performance compared to known CABAC lossless coding mode. Nevertheless, configuring an encoder with less than all of these configurations in any combination, e.g. one of these configurations or any two of these configurations, is also possible and practical, and also improves coding performance compared to known CABAC lossless coding mode.

In the foregoing, configurations that may be implemented by the electronic device 1422 are illustrated in FIGS. 14, 17, and 19. Configuring a decoder with all of these configurations improves coding performance compared to known CABAC lossless coding mode. Nevertheless, configuring a decoder with less than all of these configurations in any combination, e.g. one of these configurations or any two of these configurations, is also possible and practical, and also improves coding performance compared to known CABAC lossless coding mode.

In an example, an electronic device including a processor and a memory in electronic communication with the processor is provided. Stored in the memory are instructions executable by the processor to perform operations.

In an example, an operation may include obtaining a block representing a residual sample for lossless encoding. Another operation may include generating a significance map, wherein the generating includes populating a significance map field that corresponds to the last scanning position of the block with a value corresponding to a level of the last scanning position of the block. Another operation may include generating a sequence of syntax elements including the significance map having the value. Another operation may include transmitting a bitstream representing the generated sequence of syntax elements to a decoder.

In an example, the sequence of syntax elements is generated without performing the last position coding step of Context Adaptive Binary Arithmetic Coding (CABAC).

In an example, another operation may include performing perform adaptive binarization using a plurality of binarization tables, wherein values of an Absolute-3 portion of the sequence of syntax elements are used as input values for the plurality of binarization tables. Another operation may include encoding a result of the adaptive binarization. The plurality of binarization tables may be VLC tables of CAVLC.

In an example, encoding the result of the adaptive binarization may include additional operations. An additional operation may include utilizing a CABAC bypassing coding mode.

In an example, the adaptive binarization of the input values using the plurality of binarization tables may include additional operations. An additional operation may include determining whether one of the input values is greater than a preset threshold. An additional operation may include performing a table update responsive to determining that said input value is greater than the preset threshold.

In an example, another operation may include accessing only a subset of the context models of CABAC. Another operation may include using the subset of the context models to code the significance map. The subset may comprise the context models of CABAC with a frequency component not equal to a first frequency.

In an example, an electronic device including a processor and a memory in electronic communication with the processor is provided. Stored in the memory are instructions executable by the processor to perform operations.

In an example, an operation may include obtaining a block representing a residual sample for lossless encoding. Another operation may include generating a sequence of syntax elements to represent the block. Another operation may include performing adaptive binarization using a plurality of binarization tables, wherein values of an Absolute-3 portion of the sequence of syntax elements are used as input values for the plurality of binarization tables. Another operation may include encoding a result of the adaptive binarization. Another operation may include transmitting the encoding to a decoder.

In an example, the plurality of binarization tables are VLC tables of CAVLC.

In an example, encoding the result of the adaptive binarization may include additional operations. An additional operation may include utilizing a Context Adaptive Binary Arithmetic Coding (CABAC) bypassing coding mode.

In an example, the adaptive binarization of the input values using the plurality of binarization tables may include additional operations. An additional operation may include determining whether one of the input values is greater than a preset threshold. An additional operation may include performing a table update responsive to determining that said input value is greater than the preset threshold.

In an example, another operation may include generating a significance map, wherein the generating includes populating a significance map field that corresponds to the last scanning position of the block with a value corresponding to a level of the last scanning position of the block. Another operation may include generating the sequence of syntax elements using the generated significance map.

In an example, the sequence of syntax elements is generated without performing the last position coding step of CABAC.

In one example, a method is provided. The method may be performed using a decoder. One operation of the method may include filtering the context models of Context Adaptive Binary Arithmetic Coding (CABAC) based on which context models are associated with frequency component. Another operation of the method may include obtaining a bitstream. Another operation of the method may include recovering a binary symbol from the bitstream. Another operation of the method may include decoding the binary symbol using the filtered context models. Another operation of the method may include recovering video data using a result of the decoding.

In an example, another operation may include recovering, from the bitstream, a sequence of syntax elements having a significance map populated with a value corresponding to a last scanning position of a block representing a residual sample. Another operation may include decoding the levels of the block using the significance map and using said value of the significance map.

In an example, the decoding of the levels of the block may be performed without performing the last position decoding step of CABAC.

In an example, another operation may include bypass decoding the recovered binary symbol. Another operation may include adaptively de-binarizing a result of the bypass decoding. Another operation may include recovering a block representing residual information using a result of the debinarization.

In an example, another operation may include using a plurality of VLC tables of CAVLC for the adaptive de-binarization.

In an example, the bypass decoding may include utilizing a CABAC bypass decoding mode.

Figure 21:
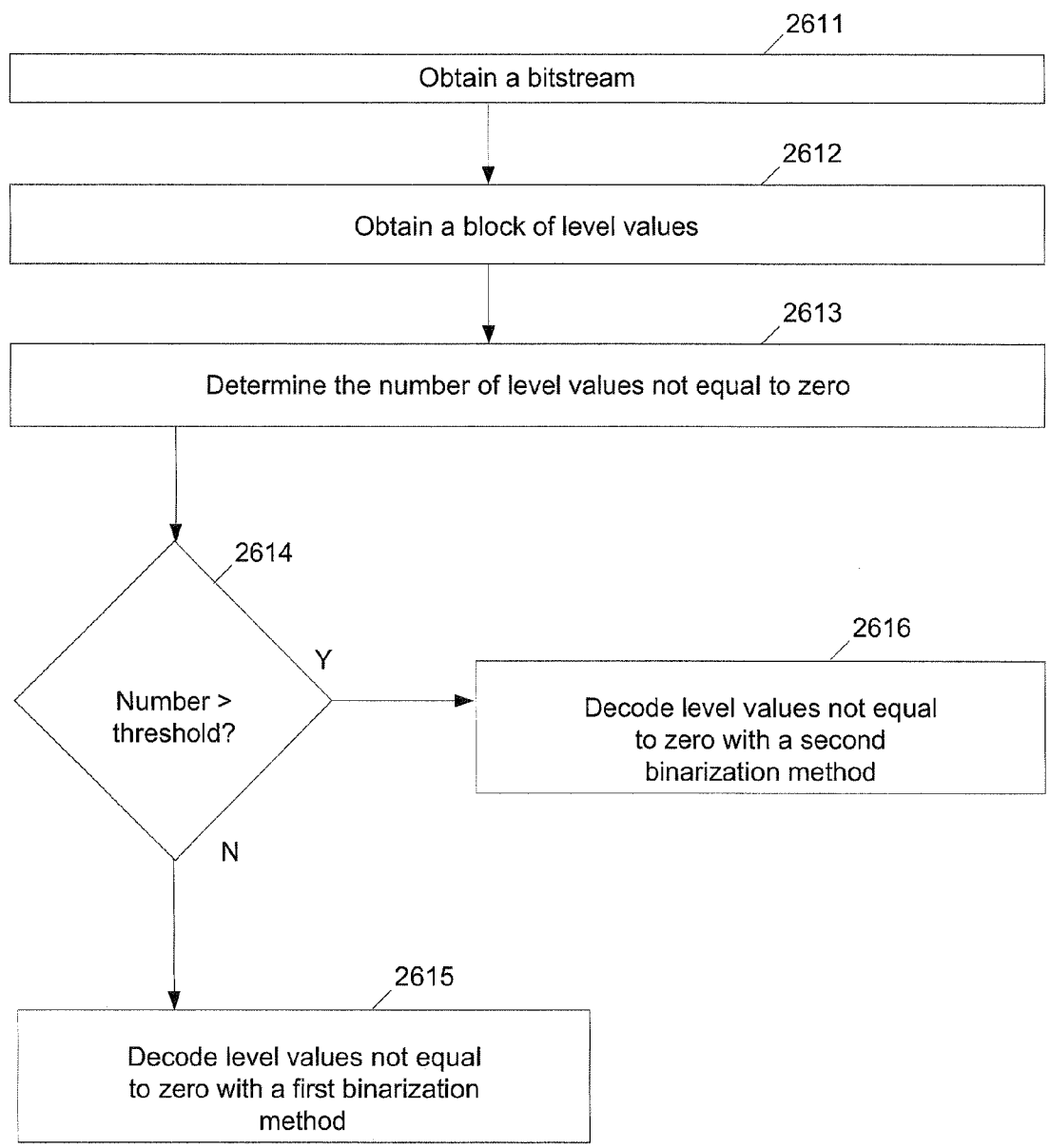
FIG. 21 is a flow diagram illustrating one configuration of a method for determining whether a high throughput mode condition is met on an electronic device at the decode-side.

FIG. 21 is a flow diagram illustrating one configuration of a method for determining whether a high throughput mode condition is met on an electronic device at the decode-side.

In block 2611, the electronic device 422 obtains a bitstream. In block 2612, the electronic device 422 obtains a block of level values. In an example, the block comprises a block of TQCs.

In block 2613, the electronic device 422 determines the number of level values that are not equal to zero. In diamond 2614, the electronic device 422 determines whether the number is greater than a preset threshold. In an example, the preset threshold may be 8, which is half of the number of values of a 4×4 block. In examples with a block size having N level values, the threshold may correspond to 50% of N. In an example, the electronic device 422 receives signaling from the electronic device 421. The signaling transmitted by the electronic device 421 may specify the preset threshold or include information that may be used by the electronic device 421 for determining the preset threshold.

If the number is not greater than the preset threshold in diamond 2614, then in block 2615 the electronic device 422 decodes level values not equal to zero with a first binarization method. If the number is greater than the preset threshold in diamond 2614, then in block 2616 the electronic device 422 decodes level values not equal to zero with a second binarization method that is different than the first binarization method. In an example, the second binarization method may comprise a high throughput debinarization mode, such as the previously described HTB mode. In an example, the first binarization method may comprise binarization of conventional CABAC.

Figure 22:
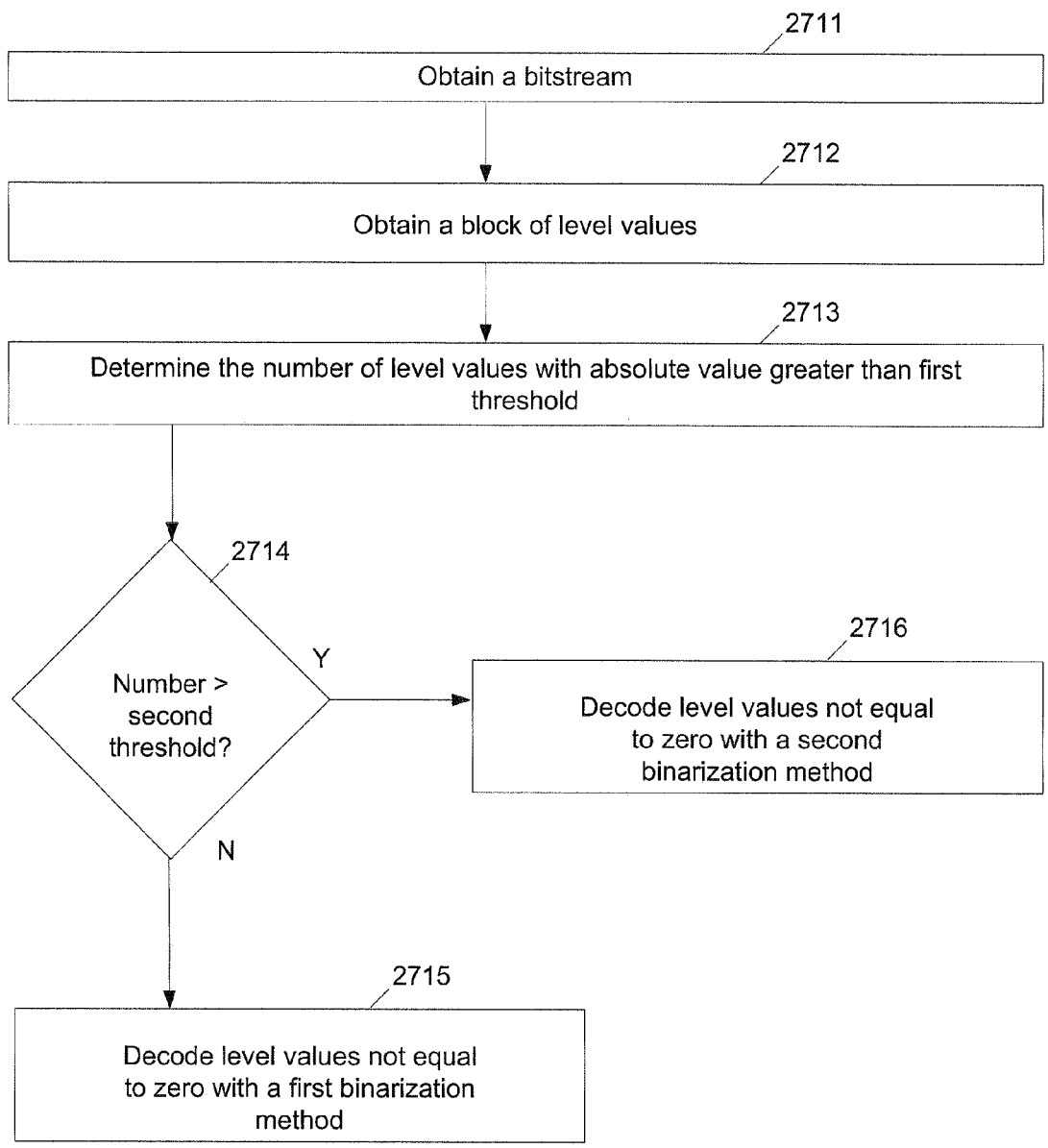
FIG. 22 is a flow diagram illustrating another configuration of a method for determining whether a high throughput mode condition is met on an electronic device at the decode-side.

FIG. 22 is a flow diagram illustrating another configuration of a method for determining whether a high throughput mode condition is met on an electronic device at the decode-side.

In block 2711, the electronic device 422 obtains a bitstream. In block 2712, the electronic device 422 obtains a block of level values. In an example, the block comprises a block of TQCs.

In block 2713, the electronic device 422 determines the number of level values with an absolute value greater than a first preset threshold. In an example, the first preset threshold may be either 1 or 2, although other first preset thresholds may be used in other examples. In diamond 2714, the electronic device 422 determines whether the number is greater than a second preset threshold. In an example, the second preset threshold may be 8, which is half of the number of values of a 4×4 block. In examples with a block size having N level values, the second preset threshold may correspond to 50% of N.

In an example, the electronic device 422 receives signaling from the electronic device 421. The signaling transmitted by the electronic device 421 may specify the first preset threshold and/or the second present threshold, or include information that may be used by the electronic device 421 for determining the first preset threshold and/or the second present threshold.

If the number is not greater than the second preset threshold in diamond 2714, then in block 2715 the electronic device 422 decodes level values not equal to zero with a first binarization method. If the number is greater than the preset threshold in diamond 2714, then in block 2716 the electronic device 422 decodes level values not equal to zero with a second binarization method that is different than the first binarization method. In an example, the second binarization method may comprise a high throughput debinarization mode, such the previously described HTB mode. In an example, the first binarization method may comprise binarization of known CABAC decoding.

Figure 23:
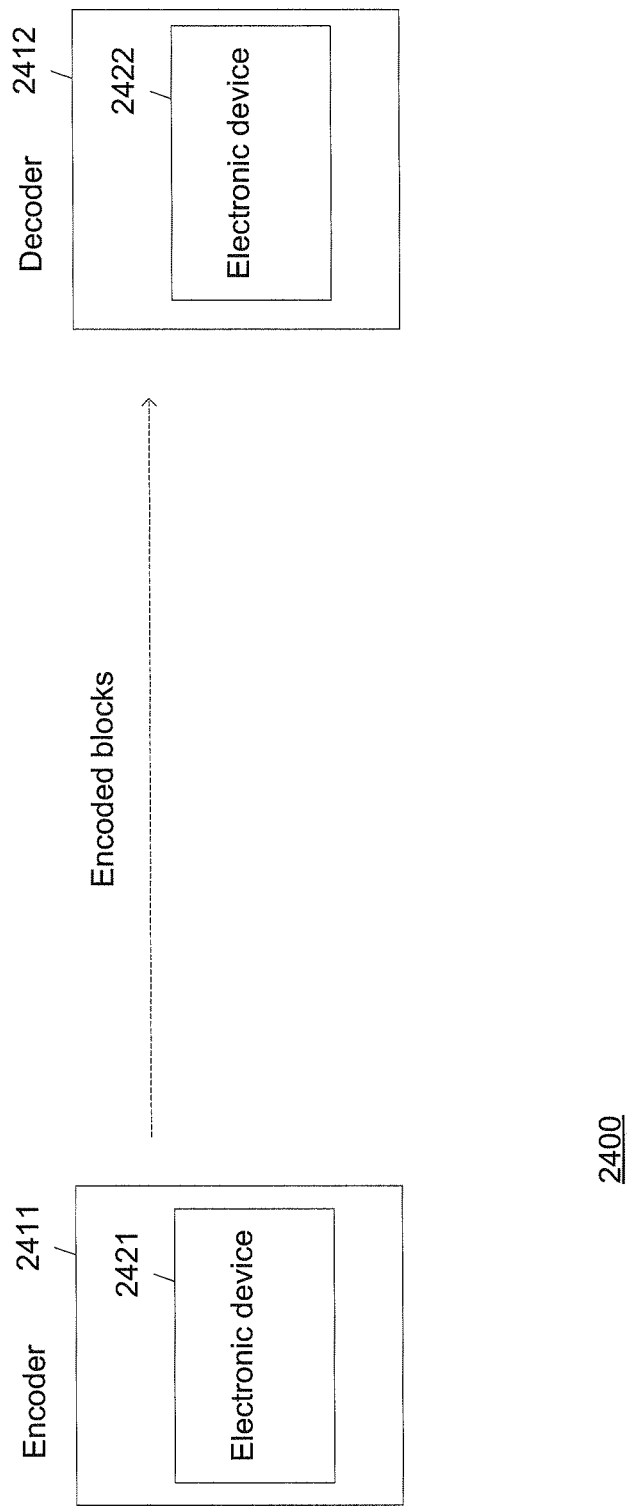
FIG. 23 is a block diagram illustrating an example of an encoder and a decoder.

FIG. 23 is a block diagram illustrating an example of an encoder and a decoder.

The system 2400 includes an encoder 2411 to generate encoded blocks to be decoded by a decoder 2412. The encoder 2411 and the decoder 2412 may communicate over a network.

The decoder 2412 includes an electronic device 2422 configured to decode using the high throughput significance map processing. The electronic device 2422 may comprise a processor and memory in electronic communication with the processor, where the memory stores instructions being executable to perform the operations shown in FIGS. 24-27.

The encoder 2411 includes an electronic device 2421, which may comprise a processor and memory in electronic communication with the processor, where the memory stores instructions being executable by the processor to perform operations that will be understood by one of ordinary skill in the art from the description of the configurations shown in FIGS. 24-27 and the corresponding description thereof.

Figure 24:
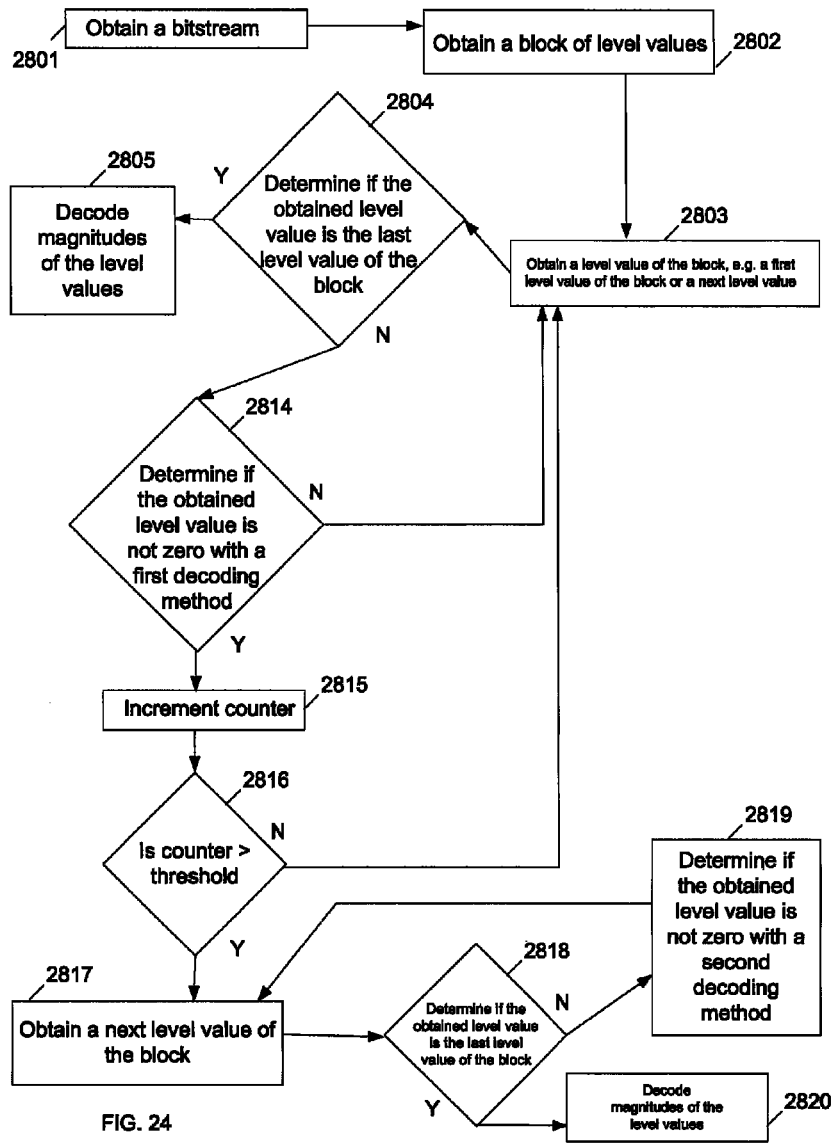
FIG. 24 is a flow diagram illustrating a configuration of a method for high throughput significance map decoding on an electronic device at the decode-side.

FIG. 24 is a flow diagram illustrating a configuration of a method for high throughput significance map decoding on an electronic device at the decode-side.

In block 2801, the electronic device 2422 obtains a bitstream. In block 2802, the electronic device 2422 obtains a block of level values. In an example, the block comprises a block of TQCs. In block 2803, the electronic device 2422 obtains a level value of the block, e.g. the first level value of the block or a next level value of the block.

In diamond 2804, the electronic device 2422 determines whether the obtained level value is the last level value of the block. If the obtained level value is not the last level value in diamond 2804, then the electronic device 2422 proceeds to diamond 2814. If the obtained level value is the last level value in diamond 2804, then in block 2805 the electronic device 2422 decodes magnitudes of the level values (which may include determining both sign information and absolute magnitude for each level value).

Referring again to diamond 2814—the electronic device 2422 determines whether the obtained level value is not zero using a first decoding method. If the obtained level value is not zero in diamond 2814, the electronic device 2422 proceeds to block 2815; otherwise, the electronic device 2422 returns to block 2803. In block 2815, the electronic device 2422 increments a counter.

In diamond 2816, the electronic device 2422 determines whether a current count of the counter is greater than a preset threshold. In an example, the preset threshold may comprise the preset threshold described with reference to FIG. 21. If the current count of the counter is greater than the preset threshold in diamond 2816, the electronic device 2422 proceeds to block 2817; otherwise, the electronic device 2422 returns to block 2803.

In block 2817, the electronic device 2422 obtains the next level value of the block. In diamond 2818, the electronic device 2422 determines whether the obtained level value is the last level value of the block. If the obtained level value is not the last level value in diamond 2818, then the electronic device 2422 proceeds to block 2819; otherwise, in block 2820 the electronic device 2422 decodes magnitudes of the level values.

In block 2819, the electronic device 2422 determines whether the obtained level value is not zero using a second decoding method that is different than the first decoding method. In an example, the second decoding method comprises a high throughput decoding method, a bypass decoding method, or the like. In an example, the first decoding method is comprises the regular decoding mode of CABAC.

According to the above, a significance map may be decoded element-by-element, e.g. significance map field-by-significance map field. When the preset threshold is reached, the electronic device 2422 may change the decoding of the remaining significance map portion. A high throughput or bypass significance map decoding mode may be used for the remaining significance map portion. Therefore, decoding performance may be improved over conventional CABAC significance map decoding.

Figure 25:
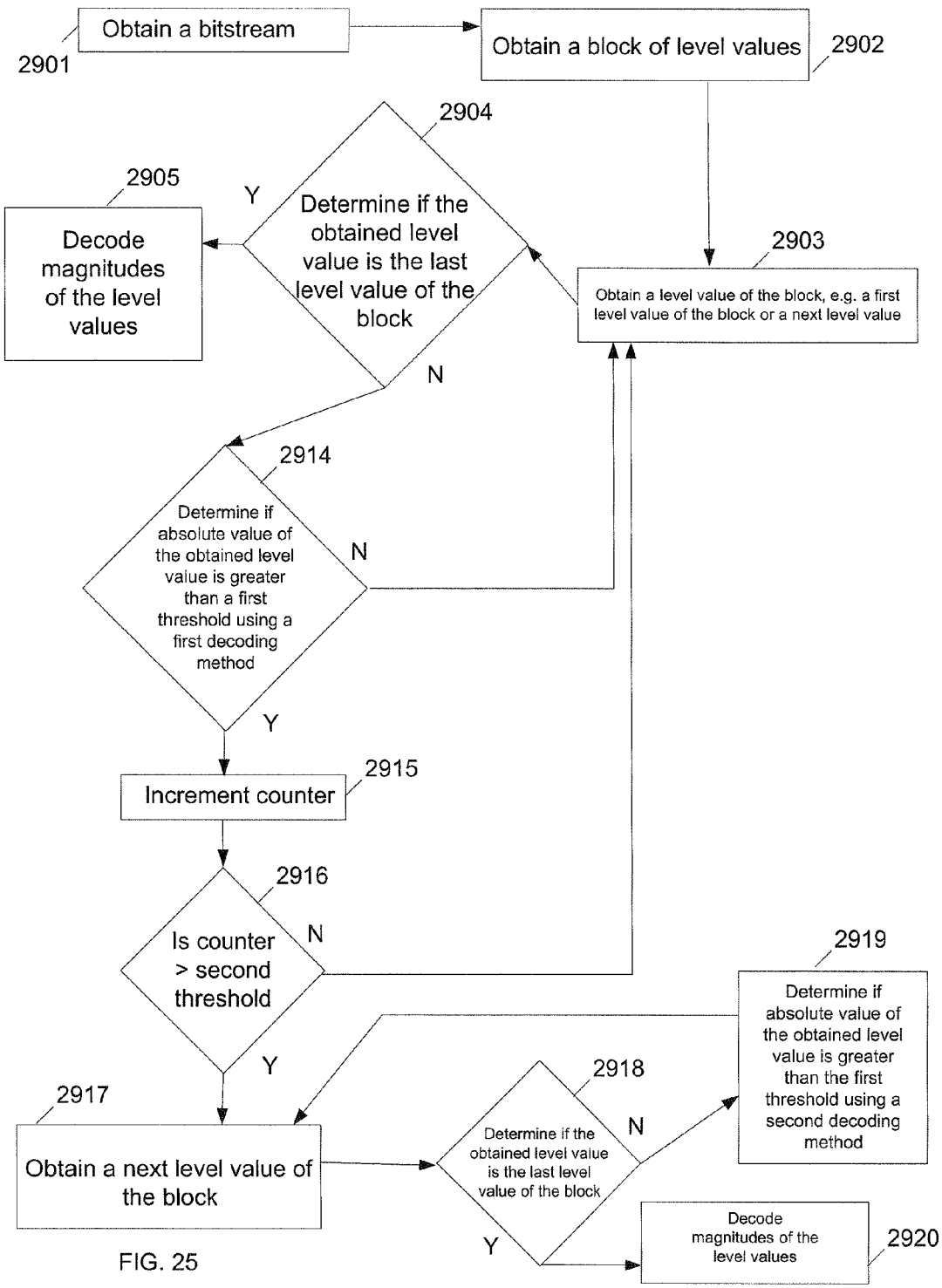
FIG. 25 is a flow diagram illustrating another configuration of a method for high throughput significance map decoding on an electronic device at the decode-side.

FIG. 25 is a flow diagram illustrating another configuration of a method for high throughput significance map decoding on an electronic device at the decode-side.

In the method shown in FIG. 25, processes 2901-2905 may be performed as shown, similar to processes 2801-2805 (FIG. 24). In diamond 2914, the electronic device 2422 determines whether the absolute value of the obtained level value is greater than a first threshold using a first decoding method. In an example, the first threshold may be either 1 or 2, although other first thresholds may be used in other examples. If the absolute value of the obtained level value is greater than the first threshold in diamond 2914, the electronic device 2422 proceeds to block 2915; otherwise, the electronic device 2422 returns to block 2903. In block 2915, the electronic device 2422 increments a counter.

In diamond 2916, the electronic device 2422 determines whether a current count of the counter is greater than a second preset threshold. In an example, the second preset threshold may be 8, which is half of the number of values of a 4×4 block. In examples with a block size having N level values, the second preset threshold may correspond to 50% of N. If the current count of the counter is greater than the second threshold in diamond 2916, the electronic device 2422 proceeds to block 2917; otherwise, the electronic device 2422 returns to block 2903.

In block 2917, the electronic device 2422 obtains the next level value of the block. In diamond 2918, the electronic device 2422 determines whether the obtained level value is the last level value of the block. If the obtained level value is not the last level value in diamond 2918, then the electronic device 2422 proceeds to block 2919; otherwise, in block 2920 the electronic device 2422 decodes magnitudes of the level values.

In block 2919, the electronic device 2422 determines whether the absolute value of the obtained level value is greater than the first threshold using a second decoding method that is different than the first decoding method. In an example, the second decoding method comprises a high throughput decoding method, a bypass decoding method, or the like. In an example, the first decoding method is comprises the regular decoding mode of CABAC.

According to the above, a significance map may be decoded element-by-element, e.g. significance map field-by-significance map field. When the preset threshold is reached, the electronic device 2422 may change the decoding of the remaining significance map portion. A high throughput or bypass significance map decoding mode may be used for the remaining significance map portion. Therefore, decoding performance may be improved over conventional CABAC significance map decoding.

Figure 26:
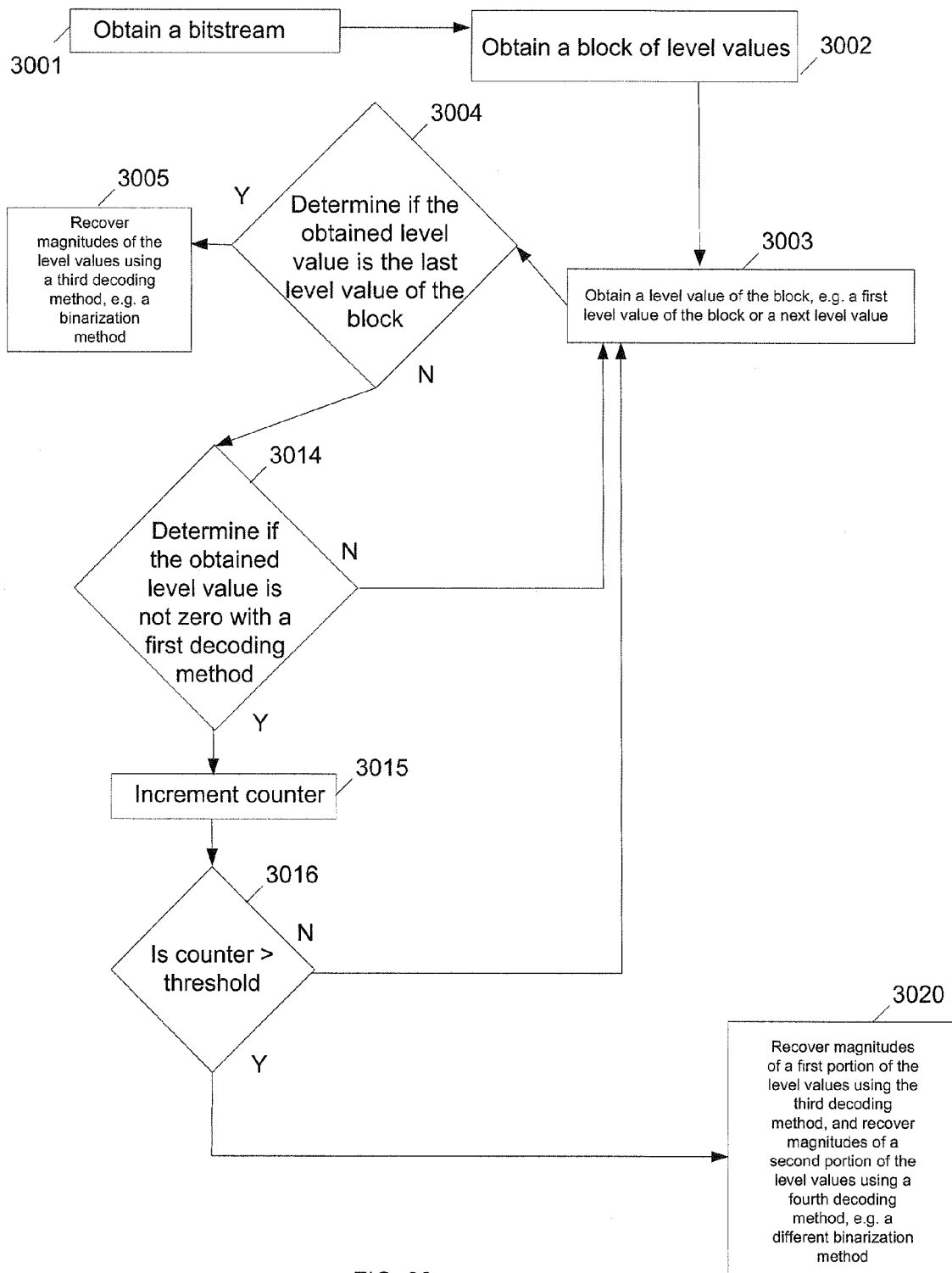
FIG. 26 is a flow diagram illustrating a configuration of a method for high throughput significance map decoding with a decode-bypass feature on an electronic device at the decode-side.

FIG. 26 is a flow diagram illustrating a configuration of a method for high throughput significance map decoding with a decode-bypass feature on an electronic device at the decode-side.

In the method shown in FIG. 26, processes 3001-3004 and 3014-3016 may be performed as shown, similar to processes 2801-2804 and 2814-2816 (FIG. 24). In block 3005, the electronic device 2422 recovers magnitudes of the level values using a third decoding method, e.g. a binarization method. In block 3020, the electronic device 2422 recovers magnitudes of a first portion of the level values using the third decoding method, and recovers magnitudes of a second portion of the level values using a fourth decoding method, e.g. a different binarization method.

In an example, the first portion of the level values comprises the level values processed with the first decoding method. The second portion of the level values comprises the level values not processed with the first decoding method.

It should be apparent that other configurations of a method for high throughput significance map decoding with a decode-bypass feature on an electronic device at the decode-side similar to the configuration shown in FIG. 26 may be possible and practical. For example, in another configuration, the electronic device 2422 determines if the absolute value of the obtained level value is greater than a first preset threshold using a first decoding method, similar to diamond 2914 (FIG. 25). Also, the electronic device 2422 determines whether the counter is greater than the second preset threshold, similar to diamond 2916 (FIG. 25).

According to the above, a significance map may be decoded element-by-element, e.g. significance map field-by-significance map field. When the preset threshold is reached, the electronic device 2422 may stop decoding the significance map (the remaining elements of the significance map are not decoded). Thereafter, the level values that correspond to the decoded elements are processed using a binarization method (e.g. a binarization method that can send the value zero), while the remaining elements are processed using a different binarization method (e.g. a binarization method that cannot send the value zero). Therefore, decoding performance may be improved over conventional CABAC significance map decoding.

Figure 27:
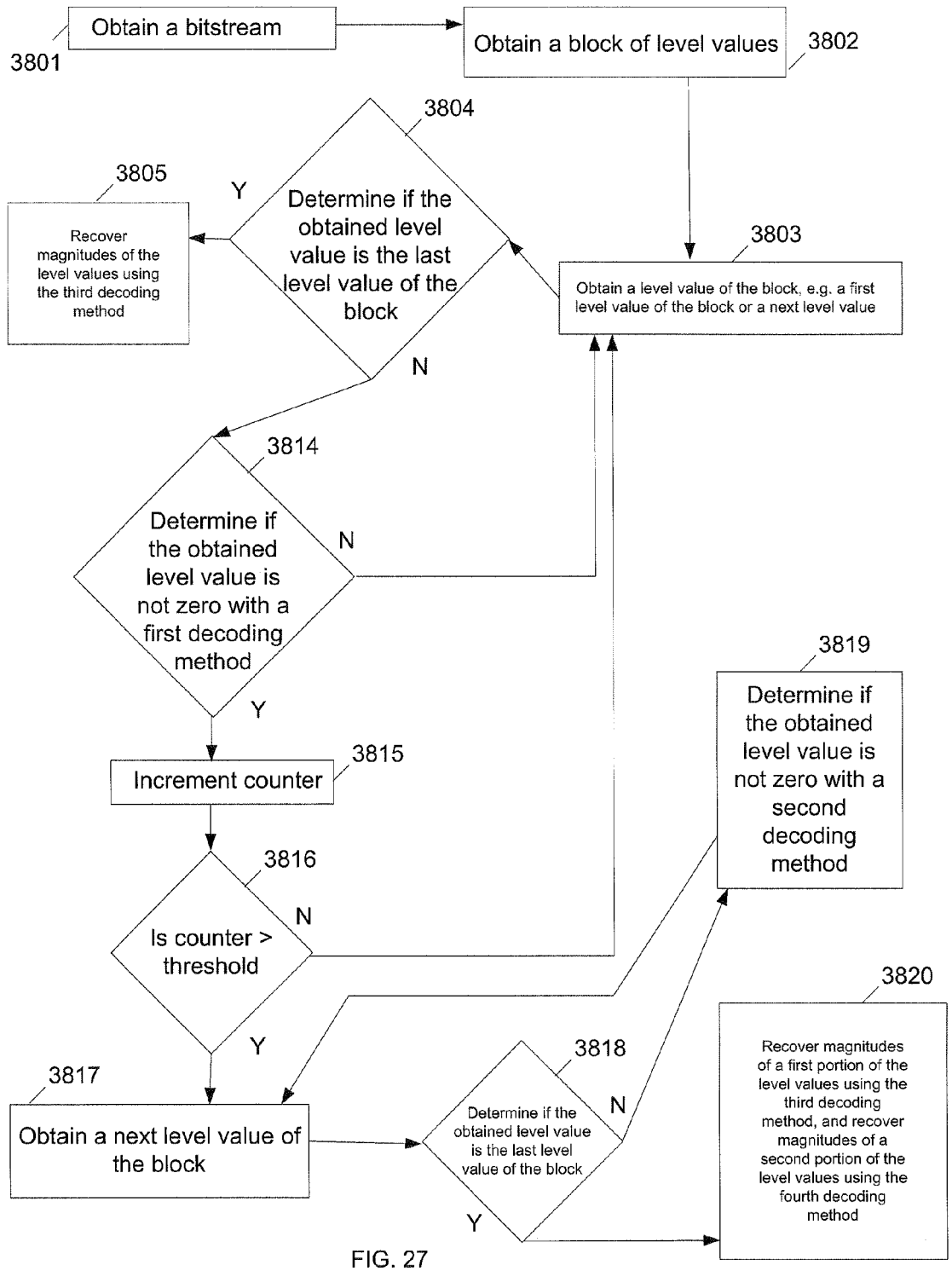
FIG. 27 is a flow diagram illustrating a configuration of a method for high throughput significance map decoding with a decode-method-switching feature on an electronic device at the decode-side.

FIG. 27 is a flow diagram illustrating a configuration of a method for high throughput significance map decoding with a decode-method-switching feature on an electronic device at the decode-side.

In the method shown in FIG. 27, processes 3801-3804 and 3814-3819 may be performed as shown, similar to processes 2801-2804 and 2814-2819 (FIG. 24). In block 3805, the electronic device 2422 recovers magnitudes of the level values using the third decoding method (the third decoding method of FIG. 26). In block 3820, the electronic device 2422 recovers magnitudes of a first portion of the level values using the third decoding method, and recovers magnitudes of a second portion of the level values using the fourth decoding method (the fourth decoding method of FIG. 26). In an example, the first portion of the level values comprises the level values obtained in block 3803, while the second portion of the level values comprises the level values obtained in block 3817.

It should be apparent that other configurations of a method for high throughput significance map decoding with a decode-bypass feature on an electronic device at the decode-side similar to the configuration shown in FIG. 27 may be possible and practical. For example, in another configuration, the electronic device 2422 determines if the absolute value of the obtained level value is greater than a first preset threshold using a first decoding method, similar to diamond 2914 (FIG. 25). Also, the electronic device 2422 determines whether the counter is greater than the second preset threshold, similar to diamond 2916 (FIG. 25).

In an example, a first electronic device including a processor and a memory in electronic communication with the processor is provided. Stored in the memory are instructions executable by the processor to perform operations.

In an example, an operation may include receiving a bitstream. Another operation may include obtaining a block of level values based on the received bitstream. Another operation may include identifying a portion of the level values according to a threshold. Another operation may include, after identifying the portion, processing any remaining ones of the level values using a high throughput significance map processing mode. Another operation may include recovering video data based on the processing.

In an example, a second electronic device including a processor and a memory in electronic communication with the processor is provided. Stored in the memory are instructions executable by the processor to perform operations. An operation may include transmitting signaling to the first electronic device, wherein the signaling identifies the threshold.

According to the above, a significance map may be decoded element-by-element, e.g. significance map field-by-significance map field. When the preset threshold is reached, the electronic device 2422 may stop decoding the significance map (the remaining elements of the significance map are not decoded). Thereafter, the level values that correspond to the decoded elements are processed using a binarization method (e.g. a binarization method that can send the value zero), while the remaining elements are processed using a different binarization method (e.g. a binarization method that cannot send the value zero). Therefore, decoding performance may be improved over conventional CABAC significance map decoding.

Lossless Coding with Different Parameter Selection Technique for CABAC in HEVC

When utilizing CABAC encoding in HEVC in the lossless coding mode, encoding/decoding is computationally complex. One reason for the computation complexity is the encoding of the syntax element "Absolute-3". In known CABAC coding, the Exponential-Golomb-Rice coding method is used to encode the syntax element.

By way of background, the Exponential-Golomb-Rice (G-R) coding method utilizes the Rice parameter update table shown in FIG. 28. The G-R coding method is applied to code syntax element "Absolute-3" (i.e. the last line of the table of FIG. 2) in known lossless coding mode of CABAC, as explained in more detail in the next paragraph.

The Rice parameter controls the conversion of symbols to bins. To illustrate by way of example, consider using the table of FIG. 28 and G-R coding to convert the symbols 0, 11, 4 . . . , where "0" (the first symbol) is the initial symbol in a sub-block. The Rice parameter is initialized at zero for the first symbol, because the first symbol is the initial symbol in the sub-block. The first symbol "0" is coded using the current Rice parameter of zero. In one example, the process of coding a symbol with a Rice parameter of RP consists of calculating the value Quotient=floor((symbol−1)/RP) and generating an output containing a Quotient string of bins equal to 1 followed by a bin equal to 0. Here, Quotient is an integer and floor( ) is an operation that maps a value containing an integer and fractional component to the integer component. For illustration, coding a symbol of "5" with Rice parameter 3, would result in a Quotient value of 1 and the output bins of "01". Similarly, coding a symbol of "100" with Rice parameter 33 would result in a Quotient value of 3 and the output bins of "0001". In an alternative example, the process of coding a symbol with a Rice parameter of RP consists of calculating the value Quotient=floor((symbol−1)/RP) and generating an output containing a Quotient string of bins equal to 0 followed by a bin equal to 1. In yet another example, the process of coding a symbol with Rice parameter of RP consists of selecting an RP-th lookup table that defines a mapping between symbols and a sequence of bins from a set of lookup tables. Given that the lookup result is zero according to the table of FIG. 28, the Rice parameter does not update for the next symbol. The second symbol "11" is thus coded using the current Rice parameter of zero. Given that the lookup result ("2") for the second symbol "11" and Rice parameter "0" is different than the current Rice parameter value (i.e. zero), the Rice parameter is updated from zero to two. The third symbol "4" is then coded with the current Rice parameter of two. Given that the lookup result is not a different value than the current Rice parameter, the Rice parameter of two is used for the next symbol.

Due to the computation complexity of G-R coding the "Absolute-3" value according to known CABAC, encoding/decoding may consume a significant amount of processing resources and/or may take a significant amount of time to complete. The disclosure that follows solves this and other problems.

Figure 29:
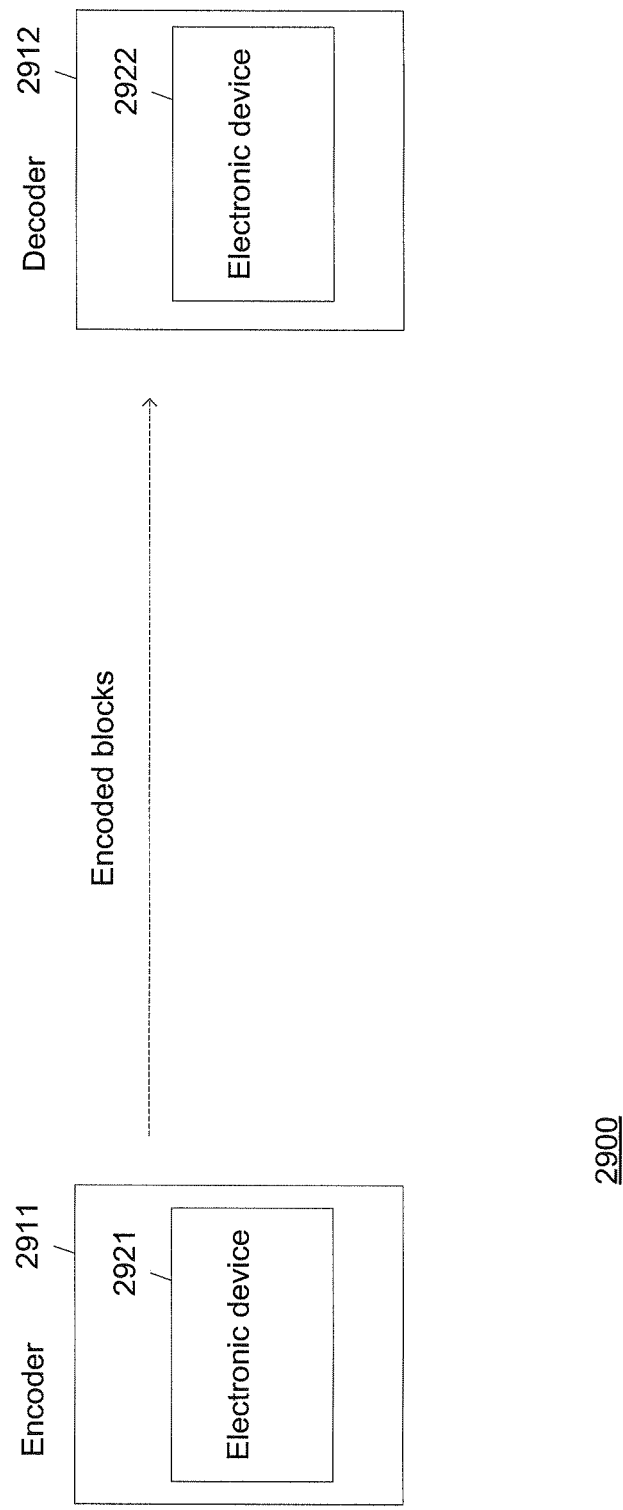
FIG. 29 is a block diagram illustrating an example of an encoder and a decoder.

FIG. 29 is a block diagram illustrating an example of an encoder and a decoder.

The system 2900 includes an encoder 2911 to generate encoded blocks to be decoded by a decoder 2912. The encoder 2911 and the decoder 2912 may communicate over a network.

The encoder 2911 includes an electronic device 2921 configured to encode using a lossless coding with different parameter selection for CABAC in HEVC. The electronic device 2921 may comprise a processor and memory in electronic communication with the processor, where the memory stores instructions being executable by the processor to perform the operations shown in FIG. 30.

The decoder 2912 includes an electronic device 2922 configured to decode using a lossless coding with different parameter selection for CABAC in HEVC. The electronic device 2922 may comprise a processor and memory in electronic communication with the processor, where the memory stores instructions being executable to perform the operations shown in FIG. 31.

Figure 30:
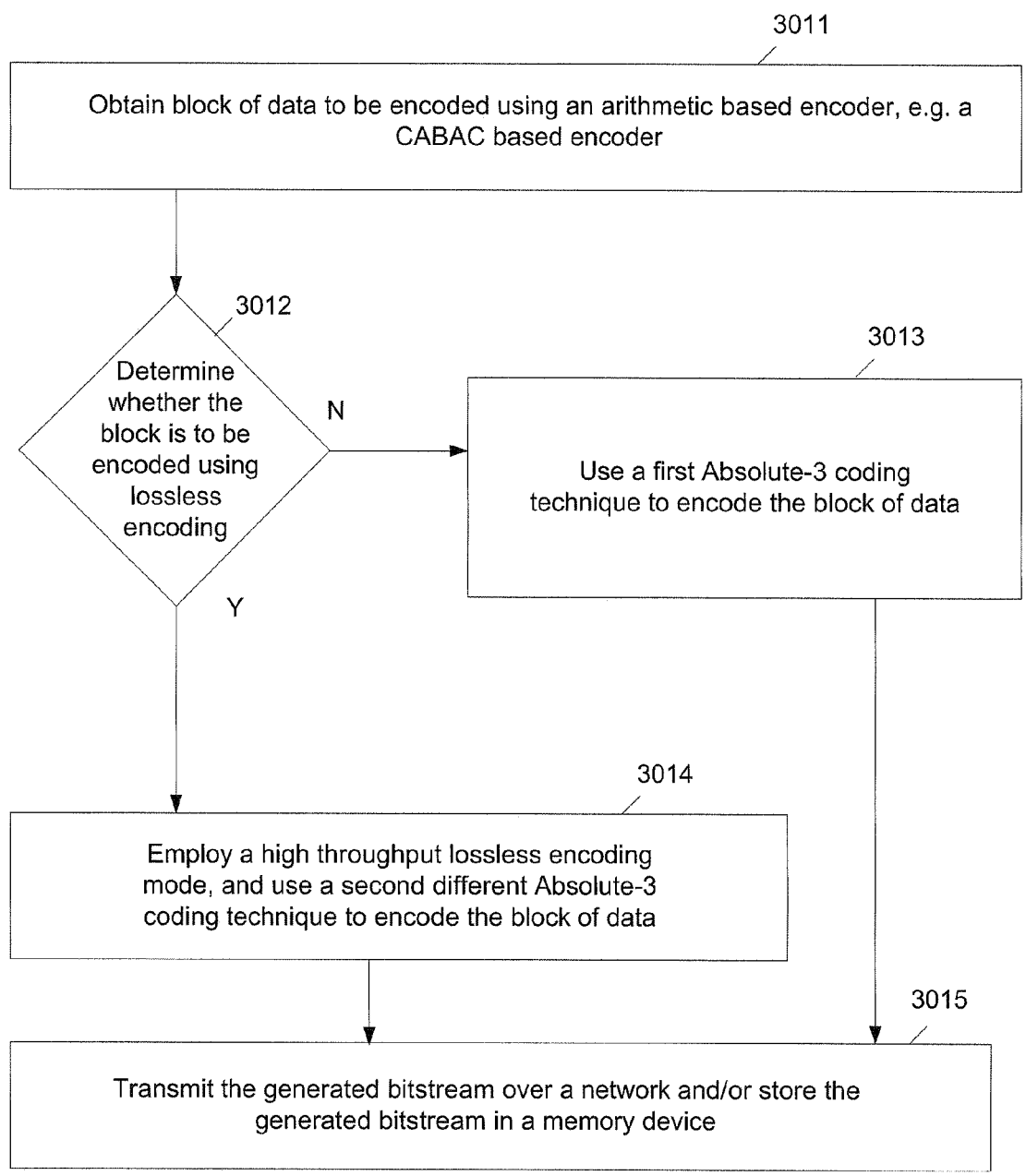
FIG. 30 is a flow diagram illustrating one configuration of a method for lossless coding with different parameter selection on an electronic device.

FIG. 30 is a flow diagram illustrating one configuration of a method for lossless coding with different parameter selection on an electronic device.

In block 3011, the electronic device 2921 obtains a block of data to be encoded using an arithmetic based encoder, e.g. a CABAC based encoder. In diamond 3012, the electronic device 2921 determines whether the block is to be encoded using lossless encoding. If the block is not to be encoded using lossless encoding, then in block 3013 the electronic device 2921 uses a first Absolute-3 coding technique to encode the block of data.

If the block is to be encoded using lossless encoding, then in block 3014 the electronic device 2921 uses a second different Absolute-3 coding technique to encode the block of data. In block 3015, the electronic device 2921 transmits the generated bitstream over a network and/or stores the generated bitstream in a memory device.

In an example, the first Absolute-3 coding technique comprises an R-G coding technique of CABAC coding, i.e. the Rice parameter initializes to zero at each sub block coding stage, and the five Rice parameters of the table shown in FIG. 28 are considered. In an example, the second different Absolute-3 coding technique does not initialize at zero at each sub block coding stage, i.e. is differently initialized, and/or uses a different Rice parameter update table, e.g. a reduced Rice parameter update table.

In an example, the different initialization may comprise initializing the Rice parameter to zero at each block and not at each sub_block. In an example, the different initialization may comprise using the last Rice parameter used in a previous sub-block as the initial Rice parameter of a current sub-block.

In an example, the different initialization may comprise initializing based on statistics of residual samples. In an example, the different initialization may comprise initializing at a predefined Rice parameter value based on block type, block size, or color information (luma/chroma), or the like, or any combination thereof. Block type is a value to represent the block based on block size of the block, prediction information (intra/inter) of the block, and color information of the block (luma/chroma). In an example, the different initialization may comprise initializing the Rice parameter at the predefined value "1" when current block type is equal to certain predefined value(s), e.g. "2" and/or "5".

In an example, the different Rice parameter update table comprises fewer Rice parameters than the Rice parameter update table used for the first Absolute-3 coding technique. In an example, the different Rice parameter update table includes only the first two cases (Rice parameter is equal to "0" and "1").

In an example, if the second different Absolute-3 coding technique is used, the electronic device 2921 may set a corresponding indicator, e.g. a flag associated with the second different Absolute-3 coding technique, to a value of 1 (which of course may include changing a default value of said flag or leaving said flag at a default value depending on design preference).

Figure 31:
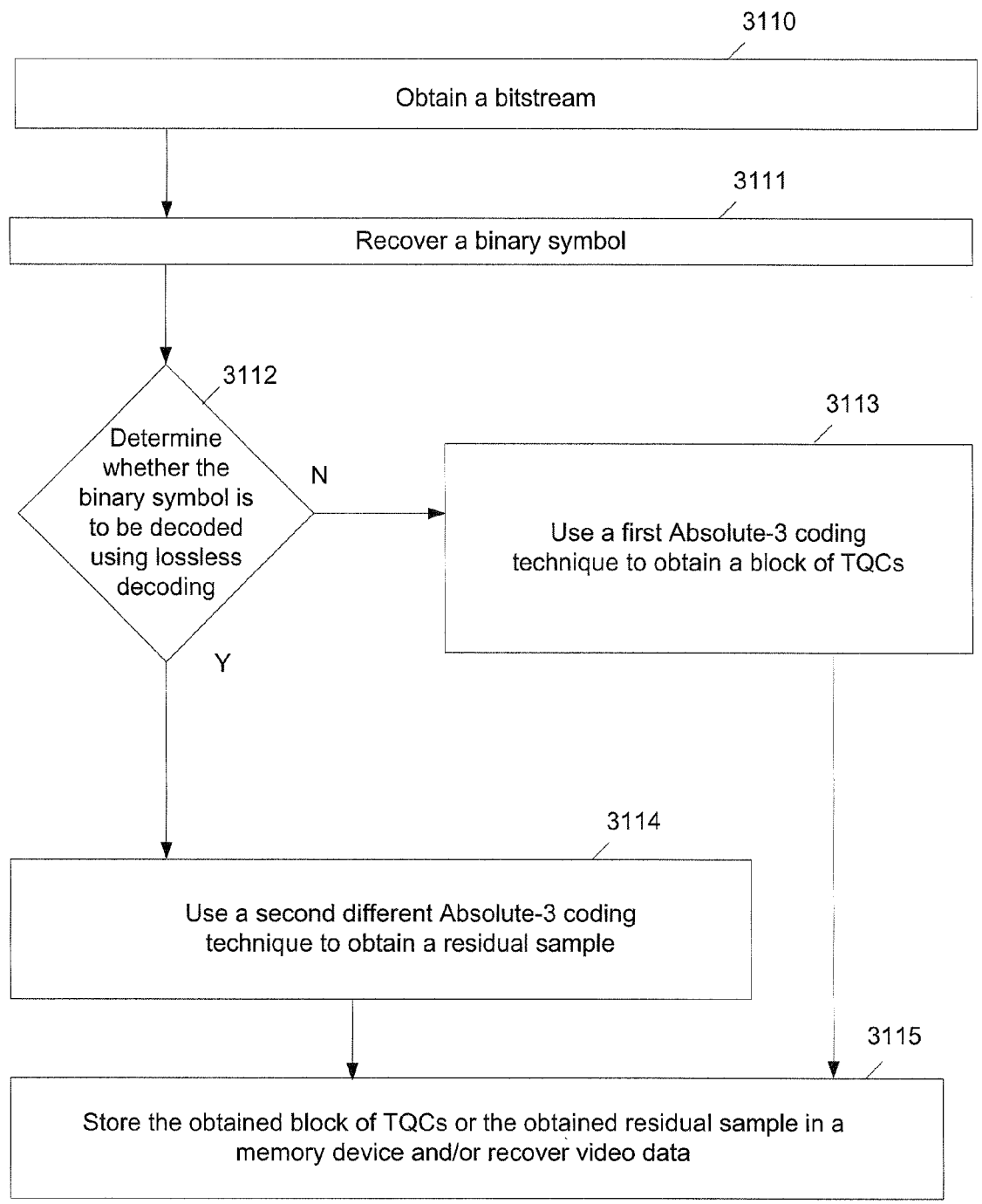
FIG. 31 is a flow diagram illustrating one configuration of a method for lossless coding with different parameter selection on an electronic device at the decode-side.
Figure 32:
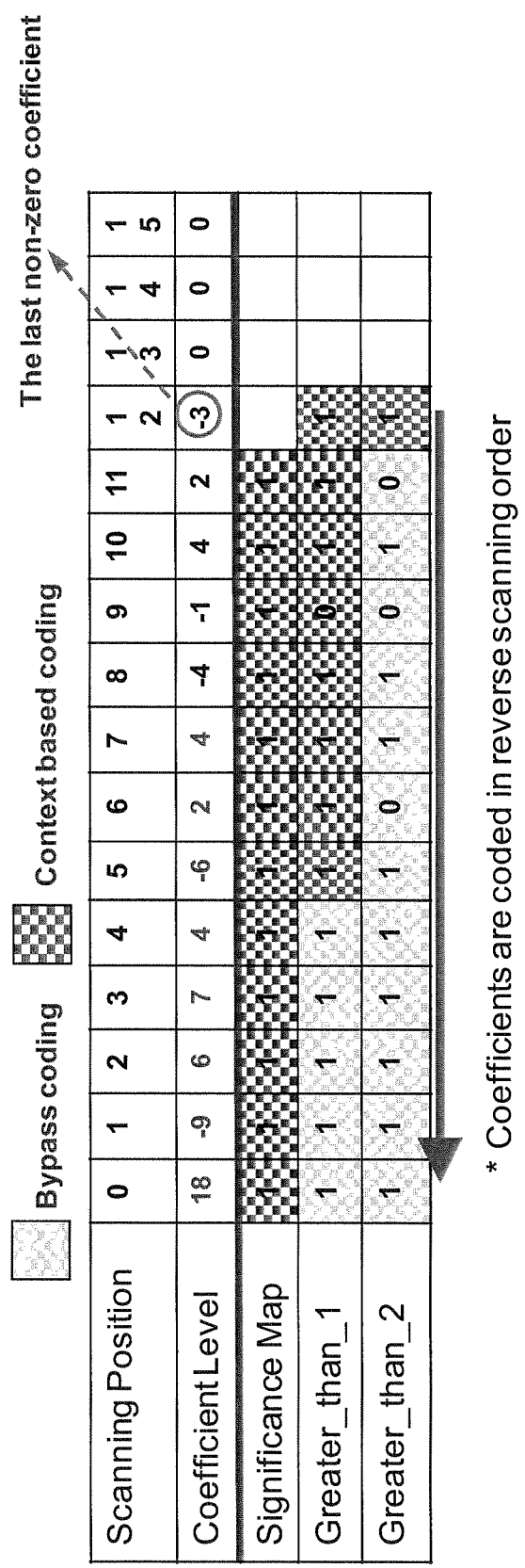
FIG. 32 is an example syntax element generated according to CABAC.
Figure 33:
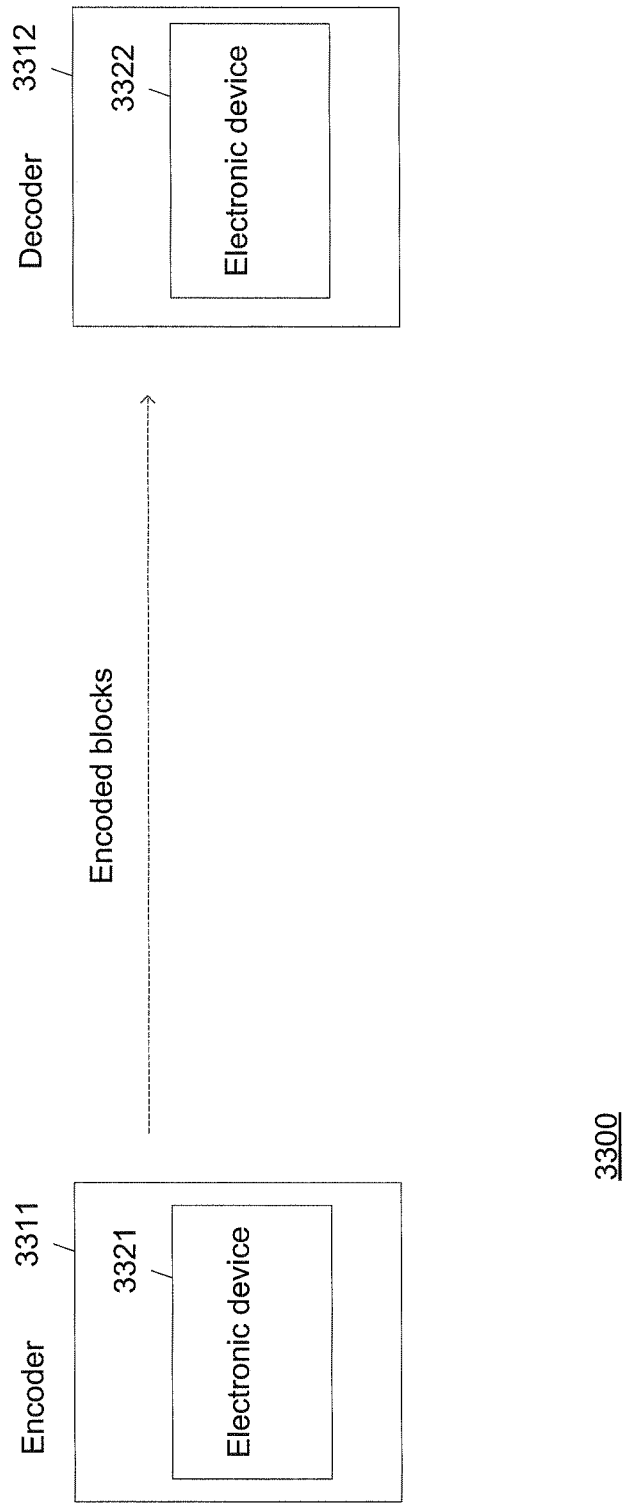
FIG. 33 is a block diagram illustrating an example of an encoder and a decoder.

FIG. 31 is a flow diagram illustrating one configuration of a method for lossless coding with different parameter selection on an electronic device at the decode-side.

In block 3110, the electronic device 2922 obtains a bitstream. In block 3111, the electronic device 2922 recovers a binary symbol from the obtained bitstream.

In diamond 3112, the electronic device 2922 determines whether the binary symbol is to be decoded using lossless decoding. In an example, the determination may include checking a header, such as a slice header, corresponding to the received bitstream. Checking the header may further comprise checking a slice header corresponding to the obtained bit stream for a value of a flag associated with a second different Absolute-3 coding technique. In another example, the determination may include checking a previously decoded symbol associated with a block, such as block type or quantization parameter that controls the conversion of coefficient levels to TQCs. If the condition is not met in diamond 3112, then in block 3113 the electronic device 2922 uses a first Absolute-3 coding technique to obtain a block of TQCs.

If the condition is met in diamond 3112, then in block 3114 the electronic device 2921 uses a second different Absolute-3 coding technique to obtain a residual sample. The electronic device 2922 may store the obtained block of TQCs or the obtained residual sample in a memory device and/or may recover video data in block 3115.

High Throughput Coding for CABAC in HEVC

When utilizing CABAC coding in HEVC, throughput performance can differ depending on different factors such as but not limited to: total number of bins/pixels, number of bypass bins/pixels, and number of regular (or context) coded bins/pixels. Therefore, depending on these factors, coding may consume a significant amount of processing resources and/or may take a significant amount of time. The disclosure that follows solves this and other problems.

By way of background, according to known CABAC, up to twenty five level code flags of a syntax element are context coded. The remaining level code flags are bypass coded. A predefined (and fixed) number of Greater_than_1 flags are context coded, namely eight Greater_than_1 flags. A predefined (and fixed) number of Greater_than_2 flags are context coded, namely one. All of the significance map flags are context coded, namely up to sixteen (a syntax element may have less than sixteen significance map flags depending on the last position information of the block. Therefore, a maximum of twenty five context coded bins are needed for a given subset block (25 bins/16 pixels=1.56 bins/pixel). The above example is when using a 4×4 sub-block.

Figure 34:
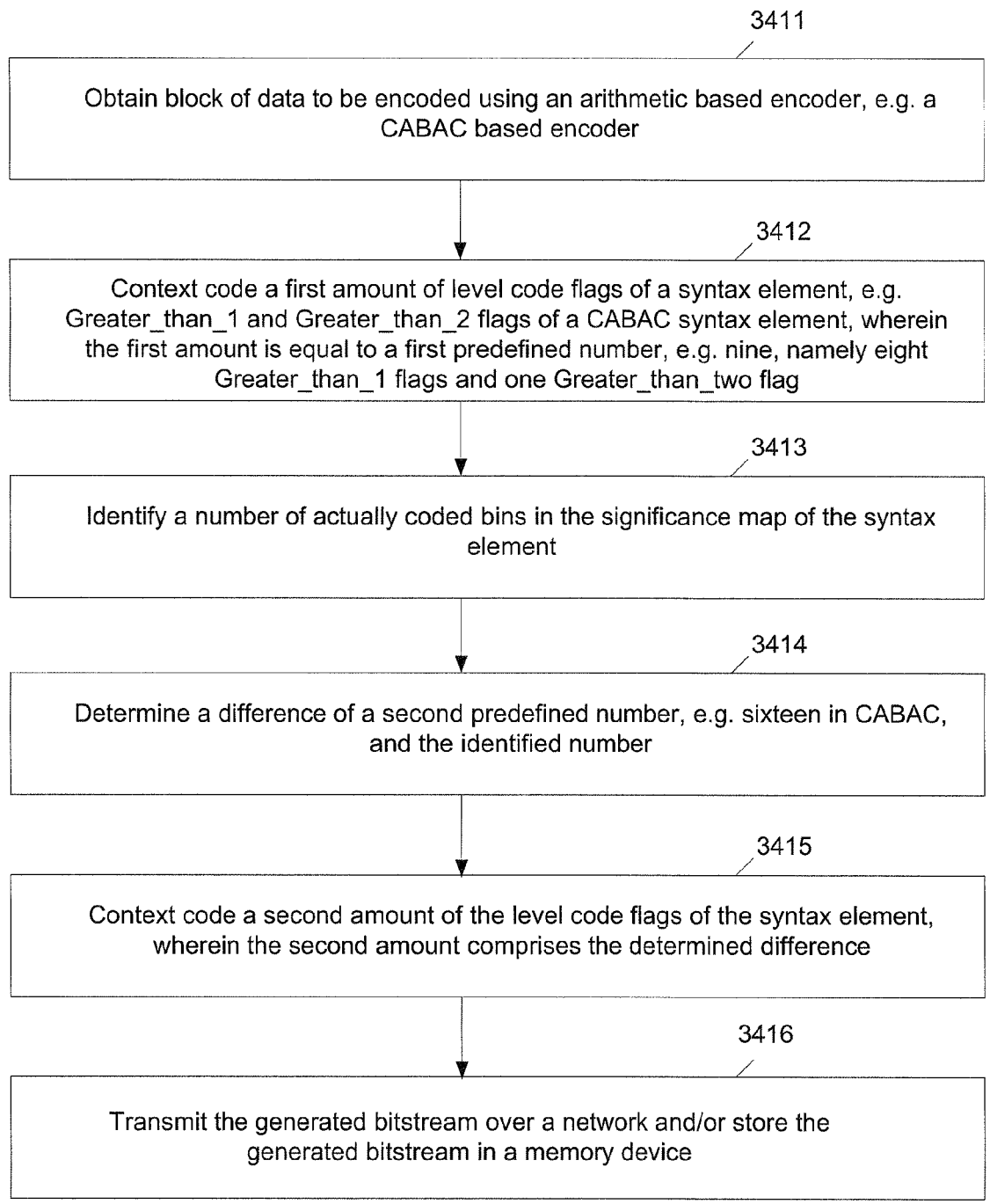
FIG. 34 is a flow diagram illustrating one configuration of a method for high throughput coding for CABAC in HEVC on an electronic device.

FIG. 34 is a flow diagram illustrating one configuration of a method for high throughput coding for CABAC in HEVC on an electronic device.

In block 3411, the electronic device 3321 obtains a block of data to be encoded using an arithmetic based encoder, e.g. a CABAC based encoder. In block 3412, the electronic device 3321 context codes a first amount of level code flags of a syntax element, e.g. Greater_than_1 and Greater_than_2 flags of a CABAC syntax element. The first amount comprises a first predefined number, e.g. nine, namely eight Greater_than_1 flags and one Greater_than_2 flag.

In block 3413, the electronic device 3321 identifies a number of actually coded bins in the significance map of the syntax element. In block 3414, the electronic device 3321 determines a difference of a second predefined number, e.g. sixteen in CABAC, and the identified number. In block 3415, the electronic device 3321 context codes a second amount of the level code flags, wherein the second amount comprises the determined difference. In block 3416, the electronic device 3321 transmits the generated bitstream over a network and/or stores the generated bitstream in a memory device.

In an example, if the configuration shown in FIG. 34 is used, the electronic device 3321 may set a corresponding indicator, e.g. a flag, to a value of 1 (which of course may include changing a default value of the flag or leaving the flag at a default value depending on design preference). In an example, the indicator may identify a number of the additional Greater_than_1 and/or Greater_than_2 flags that are context coded.

An example of a syntax element generated according to the configuration described above is shown in FIG. 36. In the example, a number of actually coded bins in the significance map of the example syntax element is twelve. The determined difference between sixteen and twelve is four. The first amount of the level code flags that are context coded is nine (eight Greater_than_1 flags and one Greater_than_2 flag). The second amount of level code flags that are context coded is four. In this particular example, these four are all Greater_than_1 flags, but in other examples these four may include one or more Greater_than_1 flag and one or more Greater_than_2 flag, or four Greater_than_2 flags. The remaining level code flags are bypass encoded.

Figure 35:
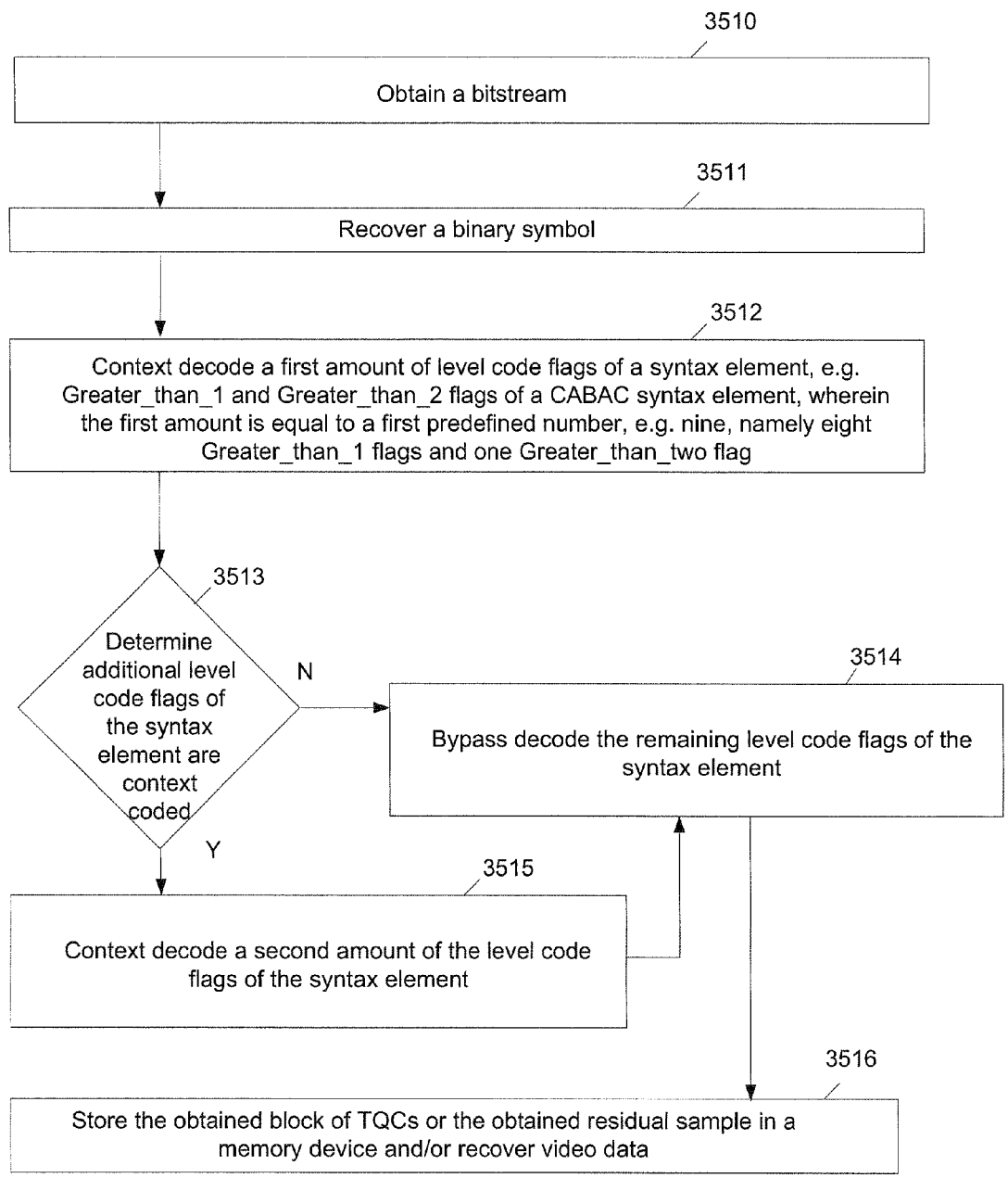
FIG. 35 is a flow diagram illustrating one configuration of a method for high throughput coding for CABAC in HEVC on an electronic device at the decide-side.

FIG. 35 is a flow diagram illustrating one configuration of a method for high throughput coding for CABAC in HEVC on an electronic device at the decide-side.

In block 3510, the electronic device 3322 obtains a bitstream. In block 3511, the electronic device 3322 recovers a binary symbol from the obtained bitstream.

In block 3512, the electronic device 3322 context decodes a first amount of level code flags of a syntax element, e.g. Greater_than_1 and Greater_than_2 flags of a CABAC syntax element, wherein the first amount is equal to a first predefined number, e.g. nine, namely eight Greater_than_1 flags and one Greater_than_2 flag. In diamond 3513, the electronic device 3322 determines whether additional level code flags of the syntax element are context coded. In an example, the determination may include checking a header, such as a slice header, corresponding to the received bitstream. Checking the header may further comprise checking a slice header corresponding to the obtained bit stream for a value of an indicator, e.g. a flag. If the electronic device 3322 determines that additional level code flags are not context coded in diamond 3513, then in block 3514 the electronic device 3322 bypass decodes the remaining level code flags of the syntax element.

If the electronic device 3322 determines that additional level code flags are context coded in diamond 3513, then in block 3515 the electronic device 3322 context decodes a second amount of the level code flags of the syntax element. In an example, the electronic device 3322 may identify a number of the additional Greater_than_1 and/or Greater_than_2 flags that are context coded based on information from the slice header. In block 3514, the electronic device 3322 bypass decodes any remaining level code flags. In block 3516, the electronic device 3322 stores the obtained block of TQCs or the obtained residual sample in a memory device and/or recovers video data.

In one example, a system is provided. The system may comprise a first electronic device of an encoder, the first electronic device configured to: obtain a block of data to be encoded using an arithmetic based encoder; determine whether the block of data is to be encoded using lossless encoding; in response to determining that the block of data is not to be encoded using lossless encoding, use a first Absolute-3 coding technique to encode the block of data; in response to determining that the block of data is to be encoded using lossless encoding, use a second Absolute-3 coding technique to encode the block of data; wherein the second Absolute-3 coding technique is different than the first Absolute-3 coding technique; and cause the encoding to be stored in a memory device.

The system may further comprise a second electronic device of a decoder, the second electronic device configured to: determine whether a received binary symbol is to be decoded using lossless decoding; in response to determining that the binary symbol is not to be decoded using lossless decoding, using the first Absolute-3 coding technique to obtain a block of TQCs; and in response to determining that the binary symbol is to be decoded using lossless decoding, use the second Absolute-3 coding technique to obtain a residual sample.

The first electronic device may be configured to: in response to determining that the block of data is not to be encoded using lossless encoding, initialize a Rice parameter at zero for an initial value of a sub-block; and in response to determining that the block of data is to be encoded using lossless encoding, use a Rice parameter from a last value of a previous sub-block for an initial value of the sub-block.

The first electronic device may be configured to: in response to determining that the block of data is not to be encoded using lossless encoding, initialize a Rice parameter at zero for an initial value of a sub-block; and in response to determining that the block of data is to be encoded using lossless encoding, bypass initialization of the Rice parameter at zero for the initial value of the sub-block.

The first electronic device may be configured to: in response to determining that the block of data is to be encoded using lossless encoding, initialize the Rice parameter at a predefined value based on at least one selected from the group comprising block type, block size, and color information (luma/chroma).

The first electronic device may be configured to: in response to determining that the block of data is to be encoded using lossless encoding, initialize the Rice parameter at one when current block type is equal to two or five.

The first electronic device may be configured to: in response to determining that the block of data is not to be encoded using lossless encoding, initialize a Rice parameter at zero for an initial value of a sub-block; and in response to determining that the block of data is to be encoded using lossless encoding, bypass initialization of the Rice parameter at zero for the initial value of the sub-block.

The first electronic device may be configured to: in response to determining that the binary symbol is not to be decoded using lossless decoding, employ a first Rice parameter update table; and in response to determining that the binary symbol is to be decoded using lossless decoding, employ a second Rice parameter update table that is different that the first Rice parameter update table.

The second Rice parameter update table may comprise is a truncated version of the first Rice parameter update table. In one example, only the second Rice parameter update table is configured to prevent an update after a current Rice parameter is updated to, or initialized to, two, three, or four.

In one example, a system is provided. The system may comprise a first electronic device of an encoder, the first electronic device configured to: obtain a block of data to be encoded using an arithmetic based encoder; context code a first amount of level code flags of a syntax element, wherein the first amount is equal to a first predefined number; identify a number of actually coded bins in the significance map of the syntax element; determine a difference of a second predefined number and the identified number; context code a second amount of the level code flags of the syntax element, wherein the second amount comprises the determined difference; and cause a bitstream generated by the context coding to be stored in a memory device.

The arithmetic based encoded may comprise a CABAC encoder. The first predefined number may comprise nine. The second predefined number may comprise sixteen. The level code flags corresponding to the first amount of context coded level code flags may comprise eight "greater than 1" flags and one "greater than 2" flag. The level code flags corresponding to the second amount of context coded level code flags may comprise only "greater than 1" flags. The level code flags corresponding to the second amount of context coded level code flags may comprise only "greater than 2" flags. The level code flags corresponding to the second amount of context coded level code flags may comprise a third predefined number of "greater than 2" flags and a dynamic number of "greater than 1" flags, wherein the dynamic number comprises a difference of the second amount and the third predefined number.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. One or more of the operations, processes, and/or methods described herein may be performed by an apparatus, a device, and/or a system substantially similar to those as described herein and with reference to the illustrated figures.

A processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a conventional rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A system, comprising:
a first electronic device of an encoder, the first electronic device configured to:
obtain a block of data to be encoded using an arithmetic based encoder;
determine whether the block of data is to be encoded using lossless encoding;
in response to determining that the block of data is not to be encoded using lossless encoding, use a first Absolute-3 coding technique to encode the block of data;
in response to determining that the block of data is to be encoded using lossless encoding, use a second Absolute-3 coding technique to encode the block of data;
wherein the second Absolute-3 coding technique is different than the first Absolute-3 coding technique; and
cause the encoding to be stored in a memory device.

2. The system of claim 1, further comprising:
a second electronic device of a decoder, the second electronic device configured to:
determine whether a received binary symbol is to be decoded using lossless decoding;
in response to determining that the binary symbol is not to be decoded using lossless decoding, using the first Absolute-3 coding technique to obtain a block of TQCs; and
in response to determining that the binary symbol is to be decoded using lossless decoding, use the second Absolute-3 coding technique to obtain a residual sample.

3. The system of claim 1, wherein the first electronic device is further configured to:
in response to determining that the block of data is not to be encoded using lossless encoding, initialize a Rice parameter at zero for an initial value of a sub-block; and
in response to determining that the block of data is to be encoded using lossless encoding, use a Rice parameter from a last value of a previous sub-block for an initial value of the sub-block.

4. The system of claim 1, wherein the first electronic device is further configured to:
in response to determining that the block of data is not to be encoded using lossless encoding, initialize a Rice parameter at zero for an initial value of a sub-block; and
in response to determining that the block of data is to be encoded using lossless encoding, bypass initialization of the Rice parameter at zero for the initial value of the sub-block.

5. The system of claim 4, wherein the first electronic device is further configured to:
in response to determining that the block of data is to be encoded using lossless encoding, initialize the Rice parameter at a predefined value based on at least one selected from the group comprising block type, block size, and color information (luma/chroma).

6. The system of claim 4, wherein the first electronic device is further configured to:
in response to determining that the block of data is to be encoded using lossless encoding, initialize the Rice parameter at one when current block type is equal to two or five.

7. The system of claim 1, wherein the first electronic device is further configured to:
in response to determining that the block of data is not to be encoded using lossless encoding, initialize a Rice parameter at zero for an initial value of a sub-block; and
in response to determining that the block of data is to be encoded using lossless encoding, bypass initialization of the Rice parameter at zero for the initial value of the sub-block.

8. The system of claim 1, wherein the first electronic device is further configured to:
in response to determining that the binary symbol is not to be decoded using lossless decoding, employ a first Rice parameter update table; and
in response to determining that the binary symbol is to be decoded using lossless decoding, employ a second Rice parameter update table that is different that the first Rice parameter update table.

9. The system of claim 8, wherein the second Rice parameter update table comprises is a truncated version of the first Rice parameter update table.

10. The system of claim 9, wherein only the second Rice parameter update table is configured to prevent an update after a current Rice parameter is updated to, or initialized to, two, three, or four.

11. A method, comprising:
obtaining a block of data to be encoded using an arithmetic based encoder;
determining whether the block of data is to be encoded using lossless encoding;
in response to determining that the block of data is not to be encoded using lossless encoding, using a first Absolute-3 coding technique to encode the block of data;
in response to determining that the block of data is to be encoded using lossless encoding, using a second Absolute-3 coding technique to encode the block of data;
wherein the second Absolute-3 coding technique is different than the first Absolute-3 coding technique; and
causing the encoding to be stored in a memory device.

12. The method of claim 11, further comprising:
in response to determining that the block of data is not to be encoded using lossless encoding, initializing a Rice parameter at zero for an initial value of a sub-block; and
in response to determining that the block of data is to be encoded using lossless encoding, using a Rice parameter from a last value of a previous sub-block for an initial value of the sub-block.

13. The method of claim 11, further comprising:
in response to determining that the block of data is not to be encoded using lossless encoding, initializing a Rice parameter at zero for an initial value of a sub-block; and
in response to determining that the block of data is to be encoded using lossless encoding, bypassing initialization of the Rice parameter at zero for the initial value of the sub-block.

14. The method of claim 13, further comprising:
in response to determining that the block of data is to be encoded using lossless encoding, initializing the Rice parameter at a predefined value based on at least one selected from the group comprising block type, block size, and color information (luma/chroma).

15. The method of claim 13, further comprising:
in response to determining that the block of data is to be encoded using lossless encoding, initializing the Rice parameter at one when current block type is equal to two or five.

16. The method of claim 11, further comprising:
in response to determining that the block of data is not to be encoded using lossless encoding, initializing a Rice parameter at zero for an initial value of a sub-block; and
in response to determining that the block of data is to be encoded using lossless encoding, bypassing initialization of the Rice parameter at zero for the initial value of the sub-block.

17. The method of claim 11, further comprising:
in response to determining that the binary symbol is not to be decoded using lossless decoding, employing a first Rice parameter update table; and
in response to determining that the binary symbol is to be decoded using lossless decoding, employing a second Rice parameter update table that is different that the first Rice parameter update table.

18. The method of claim 17, wherein the second Rice parameter update table comprises is a truncated version of the first Rice parameter update table.

19. The method of claim 18, wherein only the second Rice parameter update table is configured to prevent an update after a current Rice parameter is updated to, or initialized to, two, three, or four.

20. The method of claim 11, wherein the arithmetic based encoder comprises a Context Adaptive Binary Arithmetic Coding (CABAC) based encoder.

* * * * *

UNITED STATES PATENT AND TRADEMARK OFFICE
CERTIFICATE OF CORRECTION

PATENT NO.         : 8,552,890 B2                                   Page 1 of 1
APPLICATION NO.    : 13/444710
DATED              : October 8, 2013
INVENTOR(S)        : Seung-Hwan Kim It is certified that error appears in the above-identified patent and that said Letters Patent is hereby corrected as shown below:

In the Claims

Column 28, Line 27, Claim 8, delete "different that" and insert --different than--, therefor.

Column 30, Line 7, Claim 17, delete "different that" and insert --different than--, therefor.

Signed and Sealed this
First Day of July, 2014

Michelle K. Lee
*Deputy Director of the United States Patent and Trademark Office*